United States Patent [19]

Harrington

[11] Patent Number: 5,210,699

[45] Date of Patent: May 11, 1993

[54] PROCESS FOR EXTRACTING LOGIC FROM TRANSISTOR AND RESISTOR DATA REPRESENTATIONS OF CIRCUITS

[75] Inventor: Brian K. Harrington, Santa Clara, Calif.

[73] Assignee: Siemens Components, Inc., Iselin, N.J.

[21] Appl. No.: 759,190

[22] Filed: Sep. 10, 1991

Related U.S. Application Data

[63] Continuation of Ser. No. 452,927, Dec. 18, 1989, abandoned.

[51] Int. Cl.$^5$ .............................................. G06F 15/60
[52] U.S. Cl. ..................................... 364/488; 364/578
[58] Field of Search ............... 364/488, 489, 490, 491, 364/578; 371/23

[56] References Cited

U.S. PATENT DOCUMENTS

| | | | |
|---|---|---|---|
| 4,342,093 | 7/1982 | Miyoshi | 364/578 |
| 4,527,249 | 7/1985 | Van Brunt | 364/578 |
| 4,594,677 | 6/1986 | Barlow | 364/578 |
| 4,700,187 | 10/1987 | Furtek | 340/825.83 |
| 4,703,435 | 10/1987 | Darringer et al. | 364/488 X |
| 4,715,035 | 12/1987 | Boehner | 371/23 |
| 4,727,545 | 2/1988 | Glackemeyer et al. | 371/23 |
| 4,745,084 | 5/1988 | Rowson et al. | 437/51 |
| 4,763,289 | 8/1988 | Barzilai et al. | 364/578 |
| 4,787,061 | 11/1988 | Nei et al. | 364/900 |
| 4,803,636 | 2/1989 | Nishiyama et al. | 364/488 X |
| 4,831,524 | 5/1989 | Furgerson | 364/300 |
| 4,939,681 | 7/1990 | Yokomizo et al. | 364/578 |
| 4,942,536 | 7/1990 | Watanabe et al. | 364/489 X |
| 4,945,503 | 7/1990 | Takasaki | 364/490 X |
| 4,954,953 | 9/1990 | Bush | 364/489 X |
| 5,140,526 | 8/1992 | McDermith et al. | 364/488 |

OTHER PUBLICATIONS

"Minimization Technique for Series-Gate Emitter-Coupled Logic" by C. S. Choy and P. L. Jones, IEE Proceedings, vol. 136, Pt. G, No. 3, Jun. 1989, pp. 105-113.

"Auto-Synthesis of Series-Gated Emitter-Coupled Logic" by Choy, Sep. 18-19, 1989 IEEE, Paper 8.5, pp. 221-224.

"LOGEX—An Automatic Logic Extractor from Transistor to Gate Level for CMOS Technology" by Boehner, 25th ACM/IEEE Design Automation Conference, Paper 34.2, Jun. 12-15, 1988, IEEE, pp. 517-522.

"MIS: A Multiple-Level Logic Optimization System" by Brayton et al., IEEE Transactions on Computer-Aided Design, vol. CAD-6, No. 6, Nov. 1987, pp. 1062-1081.

"Advanced Structured Analysis and Design" by Peters, published by Prentice-Hall, 1987 pp. 69-100.

Primary Examiner—Edward R. Cosimano
Attorney, Agent, or Firm—Joseph S. Codispoti; Adel A. Ahmed

[57] ABSTRACT

A process for generating a logic netlist suitable for a logic simulator model from a data or netlist representation (11) of a circuit of transistors and resistors in either emitter coupled logic or current mode logic technology. The logic netlist is formed to serve as a logic simulation model having logic elements structured and patterned to follow the circuit representation at the transistor level, most commonly known as a netlist, which includes the resistors and the overall circuit interconnection. The logic extraction process (1.0, 2.0) identifies active and passive circuit elements connected according to prescribed criteria to eliminate elements which do not contribute to logic functionality as well as identifying elements essential to providing the logic functionality. A systematic approach keeps track of circuit nodes to enable the appropriate interconnection of logic elements patterned after the physical circuit represented as the netlist.

12 Claims, 20 Drawing Sheets

ALL OCCURRENCES OF NODE B CHANGED TO NODE A

ALL OCCURRENCES OF NODE A
CHANGED TO NODE B

PROCESS FOR EXTRACTING LOGIC FROM TRANSISTOR AND RESISTOR DATA REPRESENTATIONS OF CIRCUITS

CROSS-REFERENCE TO RELATED APPLICATION

This is a continuation of Ser. No. 07/452,927 filed Dec. 18, 1989, now abandoned.

TECHNICAL FIELD

The present invention relates generally to the field of integrated circuit manufacture and testing and more specifically this field in the context of application specific integrated circuits and the development of cells or macros. In particular, the invention relates to a method of representing bipolar semiconductor combinatorial and sequential circuits, such as a macro, by a logic simulation model, particularly for purposes of logic and timing verification by interfacing with conventional simulators.

BACKGROUND OF THE INVENTION

In the development and fabrication of rather complex integrated circuits, considerable time, effort and other development resources are expended while progressing through a sequence of several necessary and distinct steps. A logic circuit design is developed in an initial step on an appropriate computer aided design (CAD) system usually in a graphical representation. Next, a simulation step is used to verify the correct functionality. Typically, several iterations between these first two steps are required to obtain the desired functionality. Upon obtaining the desired functionality, a physical representation, or design layout, is made providing the exact locations of all the polygons forming the respective areas that the transistors and resistors occupy. Depending on the circuit complexity, the entire circuit may be re-simulated with additional information based on the design layout. For example, the layout resistance and capacitance are typically required to predict the level of performance in high speed integrated circuits. At this point, the physical or hardware processing begins with the generation of masks in accordance with the design layout and their use in diffusions, and patterning of various layers in the actual fabrication process of producing the physical integrated circuit.

For a completely customized circuit wherein none of the circuit elements in the design layout have been prearranged, the designer of an integrated circuit may work at the transistor level representation which includes the transistors and resistors and their circuit interconnection. For the design of application specific integrated circuits (ASIC's), the design is simplified because the ASIC vendor supplies a set of circuit building blocks, called macrocells or macros. To achieve the desired functionality for an integrated circuit, these macros are located on a common chip and are connected together by conductive paths. Thus, the circuit designer is no longer burdened by the details of the transistor level representation. For the simulation, the circuit designer is provided a complete set of macro logic simulation models. A new and improved process for efficiently developing the basis for logic simulation models will be described. As mentioned, the logic simulation models serve as a valuable tool for facilitating the verification of the correct functionality of integrated circuits based on the macros.

The critical interim step between the transistor netlist and a logic simulation model is logic extraction. Logic simulation models fall into two classes. One class is to develop behavioral models which is a black box approach emulating the overall function. The other class is to develop structural models including logic gates patterned after the circuit representation of the transistor netlist. The latter class is more suitable for developing a logic simulation model automatically.

Conventional logic extraction is typically provided by two ways. The first way is to do so manually by analyzing the circuit representation of the transistor netlist to determine the equivalent logic level representation of the integrated circuit. The obvious disadvantages of the manual method are that it is time consuming and prone to error. Secondly, one could use a computer method based on a computer program for extracting the logic netlist but the primary purpose for such conventional methods of logic extraction is logic verification. In logic verification, it is necessary to extract an equivalent logic circuit (formed of logic gates such as OR, NOR, AND NAND gates) from the transistor netlist (representing transistors, resistors and interconnections, etc.). The result of the logic extraction can then be compared against the intended logic design to verify that the representation of a physical implementation provides the desired logical function. The requirements of an extracted logic netlist used for logic verification, and an extracted logic netlist for logic simulation have several fundamental differences which fail to satisfy three concurrent requirements.

The first of the three requirements of a new computerized tool is that it must be able to extract the logic netlist from emitter coupled logic (ECL) transistor netlists or current mode logic (CML) transistor netlists. Secondly, the extracted logic must be created so pin-to-pin timing delays are assignable to the logic elements. Finally, the extracted logic must be suitable to serve as a basis for a suitable interface for any one of a number of generally used logic simulators.

SUMMARY OF THE INVENTION

An object of the present invention is to provide a method of extracting a logic netlist that is fast, accurate, and actually simpler than manually generated logic schematics.

Another object of the invention is to provide logic netlists which are extracted from netlists indicative of ECL or CML combinatorial circuits which provides pin-to-pin timing delays assignable to logic elements, and which are suitable for serving as an interface to any one of available logic simulators.

The invention takes the form of a method for utilizing a netlist arranged in appropriate data groupings into lists of representations of passive and active circuit elements as well as interfacing lists for extracting logic by the steps of: selectively eliminating elements from the netlist failing to provide logic functionality; analyzing simplified data for representations of remaining circuit elements according to their connections to generate appropriate primitive logic elements; and detecting interconnections between remaining circuit elements according to their function and representing them by linking gating logic to provide the logic schematic.

The logic extraction process in accordance with the principles of the invention fundamentally involves transforming the transistor netlist into a logical representation of basic logic functions. In order to do the transformation accurately, four considerations are practiced. The logical representation is extracted directly from the transistor netlist, which may be indicative of either ECL or CML circuitry, to generate automatically a corresponding logic representation of the physical implementation of the circuit. A set of only primitive logic elements are used since they are compatible for use on all conventional simulators. This set includes BUF (buffer), INV (invertor), OR, NOR, AND, and NAND logic functions. Logic functions corresponding to devices in the transistor netlist are verified so that the timing delays correspond to the represented circuit behavior. The logic is extracted such that the logic schematic is a model that structurally patterns the circuit representation of the transistor netlist and is capable of interfacing conventional logic simulators.

In some of the more specific aspects of the invention, the initial step of the logic extraction process is divided into a number of basic operations wherein selected passive and active circuit elements are either removed or shorted according to their manner of representation respective to identified attributes. The interim step of the logic extraction process is divided into basic operations producing buffers from identified active and passive circuit elements, merging logic lists, removing redundant buffers, producing OR gates and merging logic lists and removing redundant buffers. The final step of the logic extraction process is divided into three basic operations. First, inverted gates are produced from the manner in which active circuit elements are in circuit relationship. Second, NOR gates are produced according to circuit relationships of active circuit elements. Finally, NOR gates are produced according to interconnections of active devices to provide a logic netlist serving as a logic model for interfacing with logic simulators to verify the actual logic represented by the transistor level netlist.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
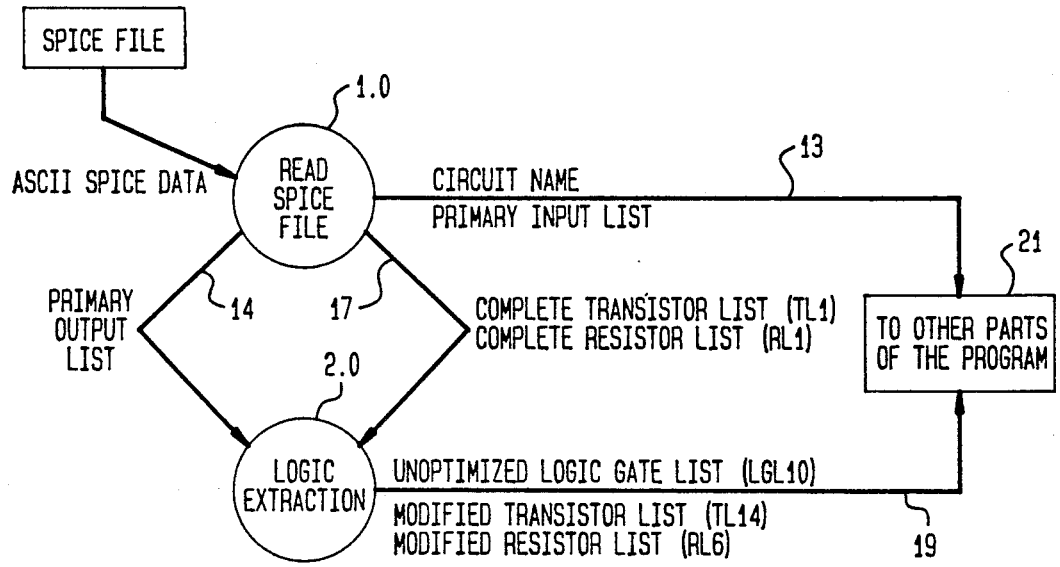
FIG. 1 is an overall and basic data flow diagram of a logic extraction process in accordance with the principles of the invention.

Throughout the drawing the same or related numerically based reference numerals are respectively used to designate the same or related component parts.

Before proceeding into the discussion of the operations and processes formed by combining the operations, some terminology basic to an understanding of an illustrative implementation of the invention will be defined.

Nodes: Electrical nodes are shown in the attached figures as uppercase letter. The usage and meaning of the term 'node' is consistent with that used by those skilled in the art.

Node Qualifiers: In some cases, it is necessary to make a distinction between the same node connection to which multiple devices (i.e., logic gates, transistors or resistors) are connected. A unique qualifier is added to the node. This is shown in that attached figures as a lower case letter next to the node. Thus node "A" does not have a qualifier, nodes "Aa", "Ab" and "Ac" are qualified. Depending on the operations being performed the qualifier can be used to see the distinction between Aa and Ab, or it can be ignored so both are node A.

Lists: Are used to indicate collections of things, these are typically implemented as linked lists, or other types of data structures that allow sequential access to all the members of the list. Lists of this type are well known to those skilled in this art.

Parallel transistors: Transistors that have collectors electrically connected together, and which have emitters connected together.

Series transistors: Transistors that have the emitter of the first transistor connected to the collector of the following transistor.

VB1, VBB1, VBB2: Reference voltages used for correct circuit operation.

VCS: Reference voltage used to control the current source.

An illustrative method in accordance with the present invention is disclosed by means of a data flow diagram together with a data dictionary listed in the Appendix which provides an insight into the composition of the data, uniqueness and consistency of names, and definitions of terms. The overall process is in the form of a top-down design. In addition, layering is used to break down or expand more complex functions into basic operations. Bubbles or circles represent functions or operations while the interconnecting arrows represent the actual data flow by which they are identified. Data flow diagraming is a well-known software documentation technique or tool for programming used by those skilled in the art. For example, chapter 5, pages 69-100 of Advanced Structured Analysis and Design by Lawrence J. Peters, copyrighted 1987 by Prentice Hall thoroughly describes this conventional documentation technique. In addition, physical representations in terms of circuit modifications are illustrated and described to define each of the basic operations.

FIG. 1 provides an overview of the data flow in accordance with the inventive principles for achieving logic extraction from SPICE File 11 wherein the netlist resides. The first operation depicted in circle 1.0 is to read in the SPICE data in ASCII form and generates a set of data outputs on line 13 called the primary input list and circuit name which data outputs are used in other parts of the program depicted as a block 21 connected to line 13. In addition, primary output list is provided on line 14, and complete lists are produced on line 17 for the transistors (TL1) and the resistors (RL1). A second operation represented by circle 2.0 is the logic extraction process which receives data outputs via lines 14 and 17 and generates a plurality of data outputs on path 19 designated as unoptimized logic gate list (LGL10) and data corresponding to modified transistor list (TL14) and modified resistor list (RL6). As can be seen in FIG. 1, these outputs are used for other portions of the program depicted as block 21.

Although the illustrative implementation of the logic extraction program is designed to obtain information from a SPICE file, there is no requirement that prohibits obtaining the data from any other appropriate source. Reading an input file (a SPICE file in this case) and extracting the needed data is well known in the industry. FIG. 1 outlines the manner in which this information can be read from the SPICE file. It does not matter where this information comes from, or how it is obtained, but it should be provided as three data inputs to the logic extraction operation.

Figure 2:
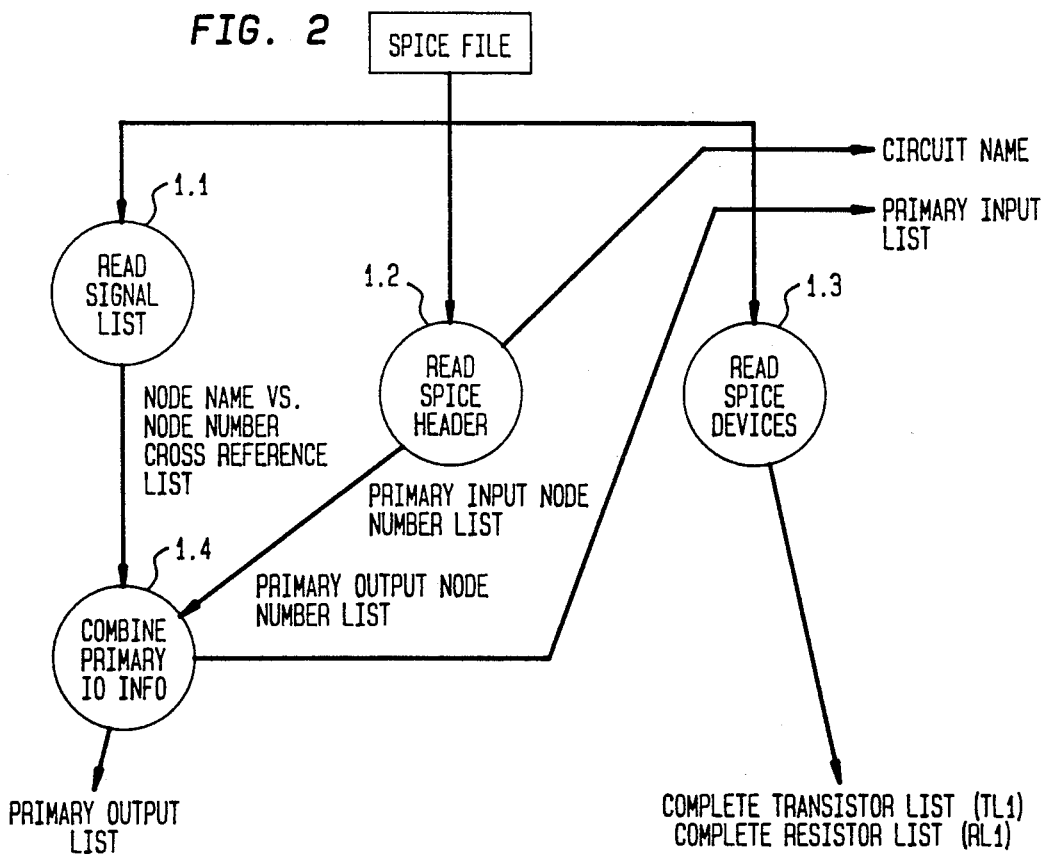
FIG. 2 is a detailed data flow diagram of the operations involved in the read SPICE file function of the process depicted in FIG. 1.

FIG. 2 provides an expansion of operation circle 1.0 wherein four different operations occur. The first two of the four operations are circle 1.1, designated read signal list and circle 1.2, designated read SPICE header. Another operation circle 1.4 for combining primary input/output information receives data from operation circles 1.1 and 1.2 and then generates the primary output list and primary input list. The final operation 1.3, designated read SPICE devices, receives the ASCII spice data and provides complete lists of transistors (TL1) and resistor (RL1).

Figure 3:
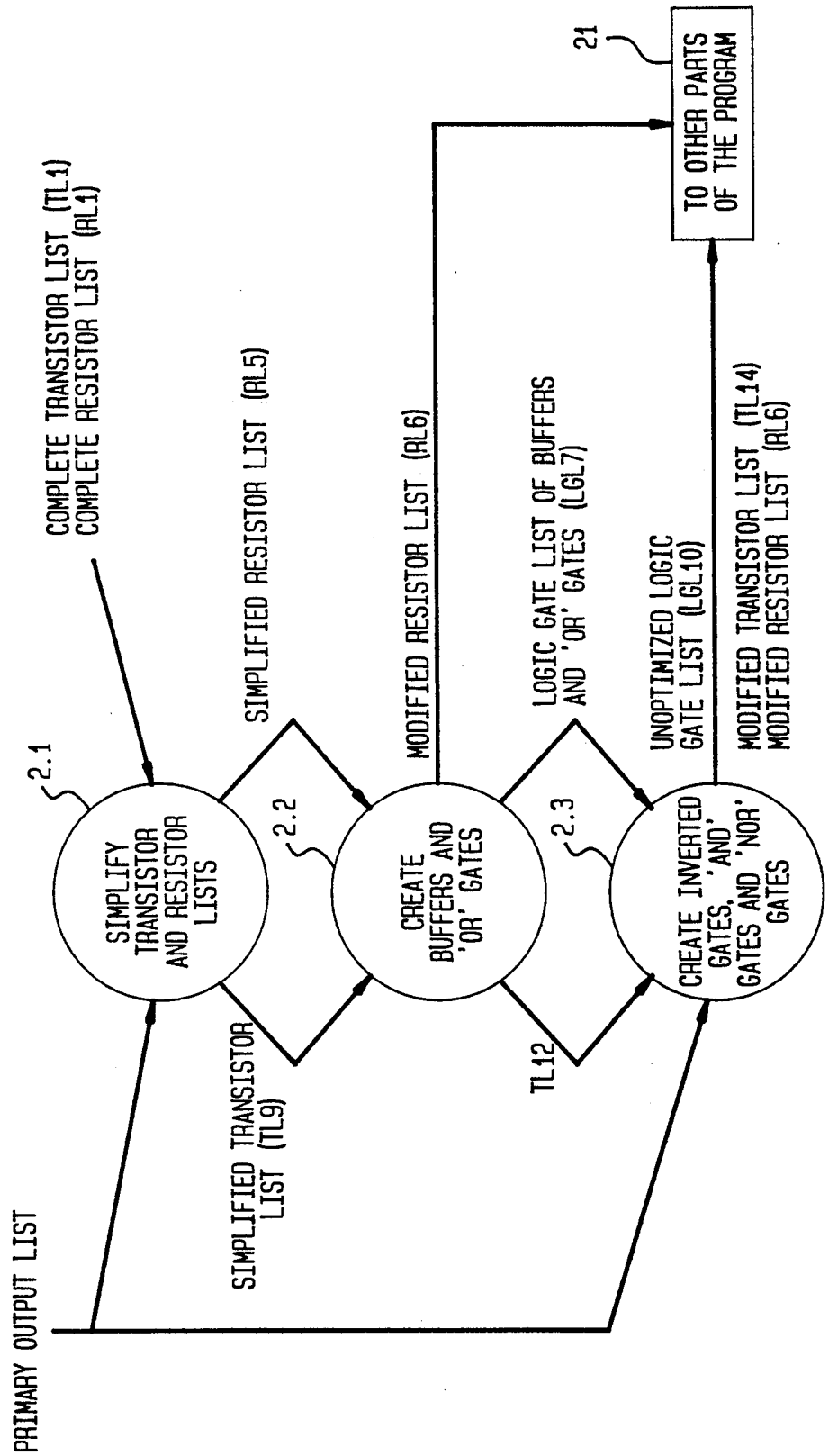
FIG. 3 provides a first expansion of the logic extraction function indicated in FIG. 1.

In FIG. 3, a further breakdown of operations into three main sections is presented for circle 2.0 in FIG. 1. The first operation represented as circle 2.1 accepts the complete lists of transistors (TL1) and resistors (RL1) and the primary output list to provide simplified lists of transistors (TL9) and resistors (RL5). Circle 2.2 utilizes this data to form buffers and gates and provide three output data sets. The first data output is modified resistor list (RL6) which is used in other parts of the program. As a second data output, logic gate list of buffers and OR gates (LGL7) is provided for subsequent operations. The third output provides data (TL12) which is a transistor list simplified by removing buffers and modifying the circuit to provide consistency.

The second and third outputs as well as data corresponding to primary output list are applied to circle 2.3 wherein inverted gates, AND gates, and NOR gates are identified from the input data to generate three data outputs. The first two data outputs provide modified lists of transistors (TL14) and resistors (RL6). A third data output provides an unoptimized logic gate list (LGL10). All of these three data set outputs are utilized in subsequent portions of the program. The primary purpose here is to extract the logic gate equivalent circuit from a transistor and resistor representation.

Figure 4:
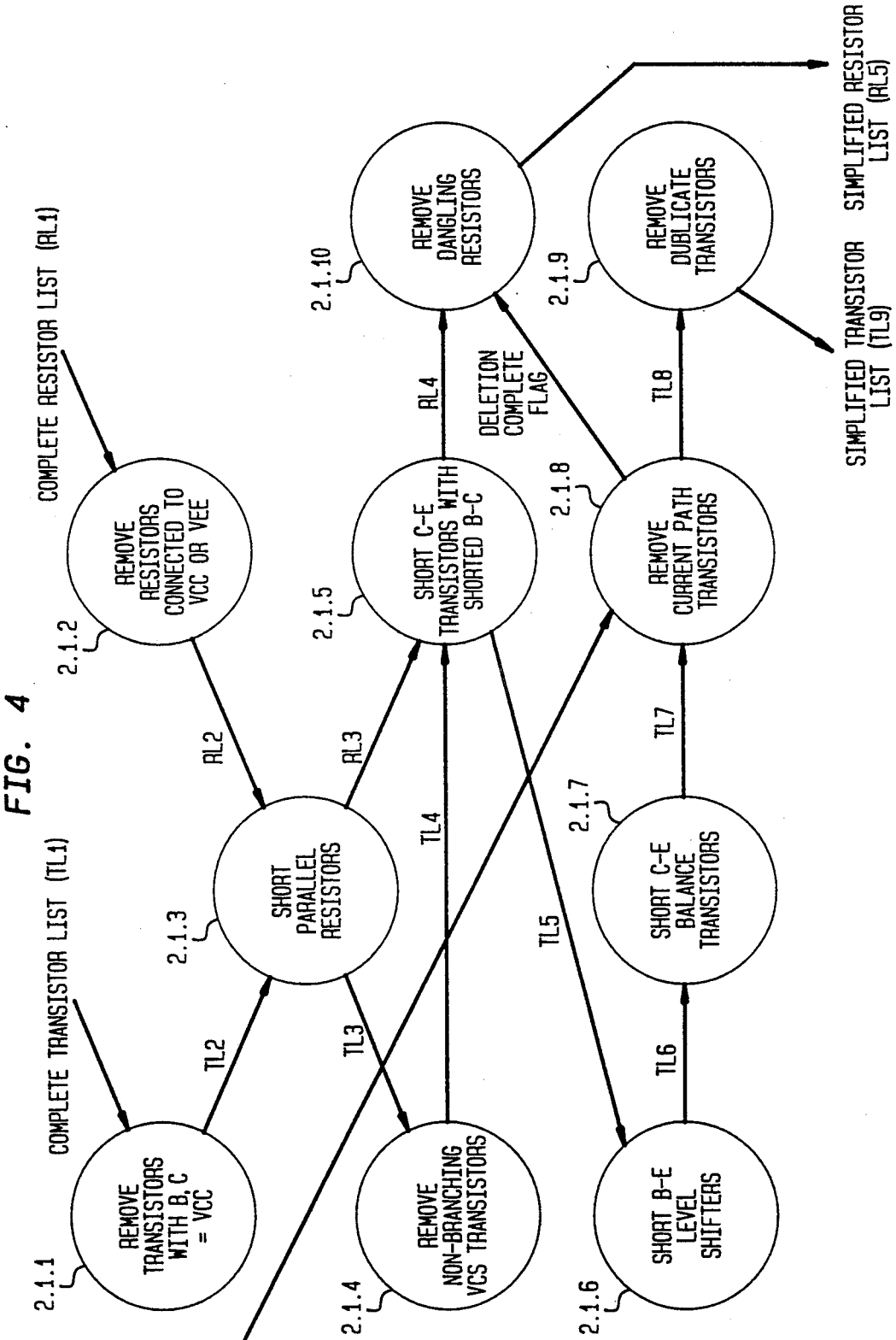
FIG. 4 illustrates the operational steps involved in the simplify transistor and resistor lists operation depicted in FIG. 3.
Figure 5:
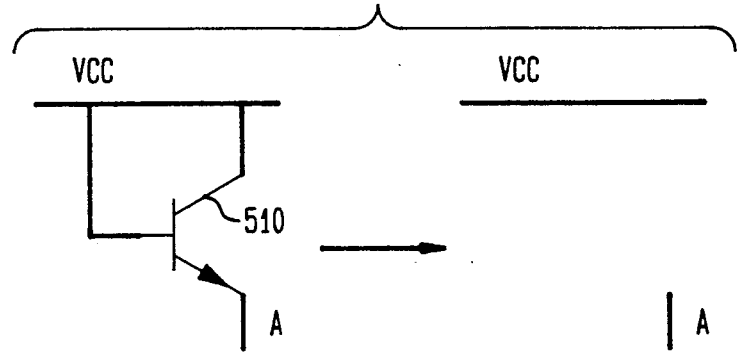
FIGS. 5-15 depict the operations of FIG. 4 related to the specific identification of various circuit elements according to their respective circuit function for appropriate elimination for failing to contribute to logic functionality of the circuit.

FIG. 4 illustrates simplifying the circuit in two ways. First, transistors and resistors that do not contribute to the logic of the circuit are removed. Second, some transistor and resistor interconnections are minimized. The operation of circle 2.1.1 calls for searching the complete transistor list (TL1) and deleting all transistors that have bases (B) and collectors (C) connected to the VCC supply voltage. In terms of the transistors identified, the portion to the left of the arrow in FIG. 5 depicts such a transistor 510 which is deleted as illustrated to the right of the arrow.

Figure 6:
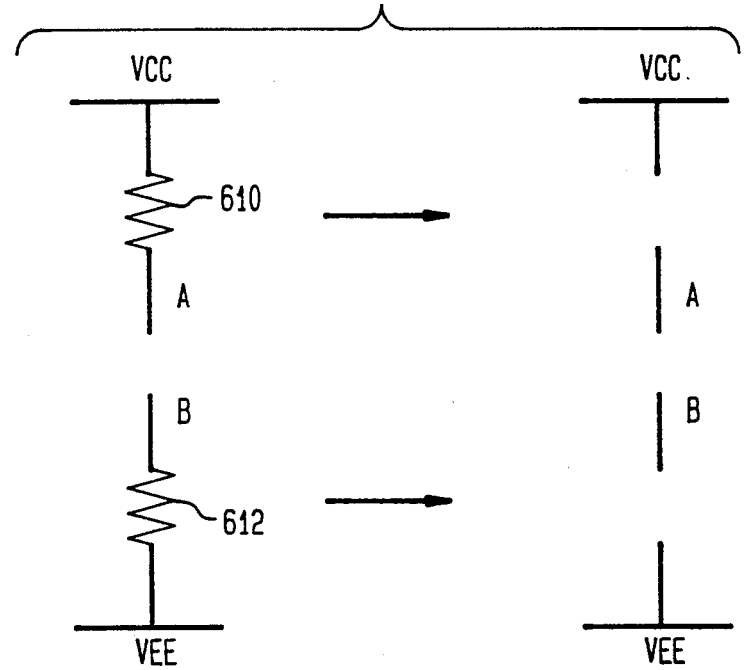

With the data input of complete resistor list (RL1), circle 2.1.2 provides an operation of searching this data and deleting all resistors that are connected to VCC or VEE supply voltages which are first identified (i.e. resistors 610 and 612) in the left portion of FIG. 6 and then eliminated as illustrated in the right hand portion of FIG. 6.

Figure 7:
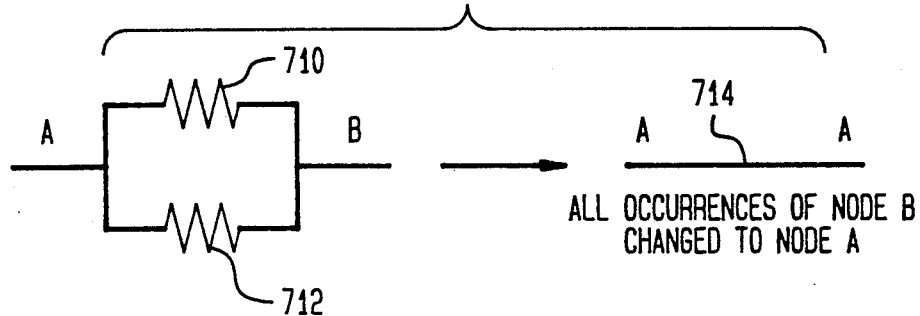

The data outputs of TL2 and RL2 of respective circles 2.1.1 and 2.1.2 are applied to circle 2.1.3 wherein the operation of shorting parallel resistors is provided as illustrated in FIG. 7. This is provided by searching the resistor list RL2 for parallel resistors. When parallel resistors 710 and 712 are identified, they are replaced with an electrical short 714 and all other transistors (TL2) and resistors (RL2) are updated to reflect the modified node identifiers. In the case of FIG. 7, if the base of a transistor (not shown) is connected to node B, the base connection is changed to node A. Since parallel resistors serve to adjust current and voltage levels, they do not contribute to the logic function.

Figure 8:
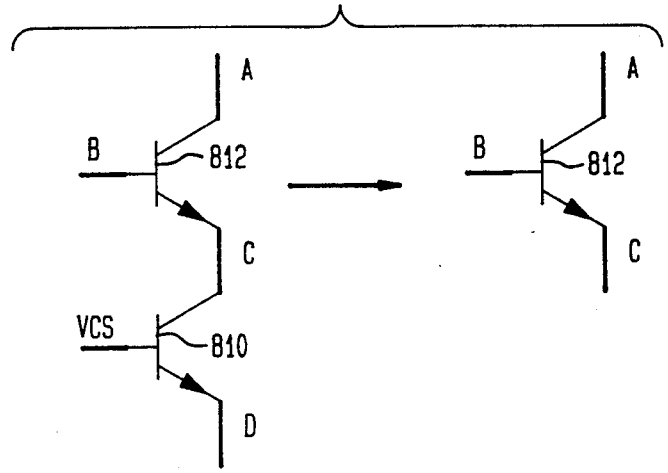
Figure 9:
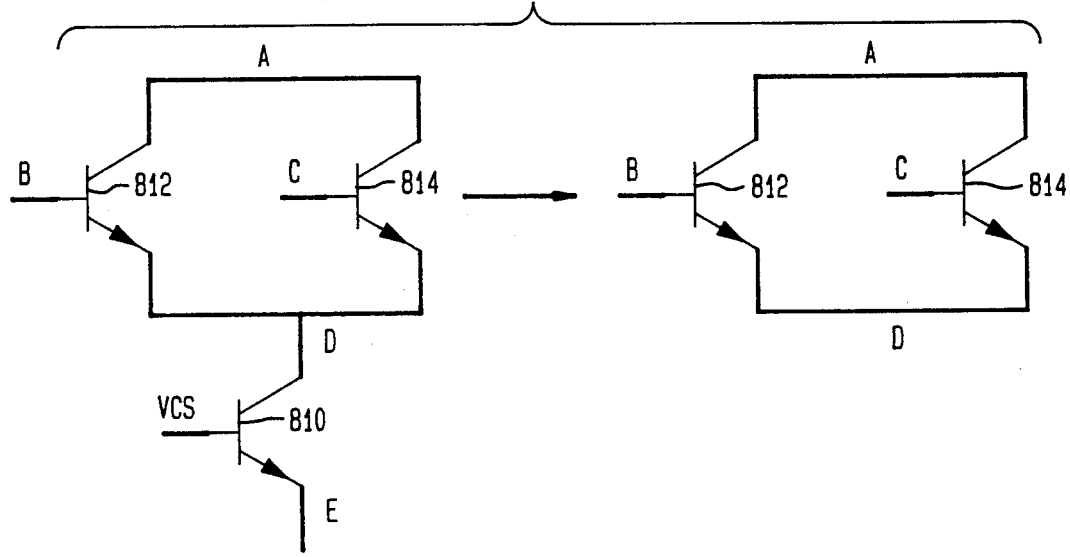

In operation circle 2.1.4, transistor list TL3 is searched for transistors (e.g. transistor 810 of FIG. 8) that have VCS on the base and have either a single transistor 812 connected to the collector as in FIG. 8, or, if they have more than one transistor 812 and 814 connected to the collector, all of these transistors are in parallel as in FIG. 9.

These non-branching VCS transistors are used for current sources, do not contribute to the circuit's logic and are removed in circle 2.1.4. Not all transistors that have VCS on the base are deleted because some of them can be used for later logic circuit optimization.

Figure 10:
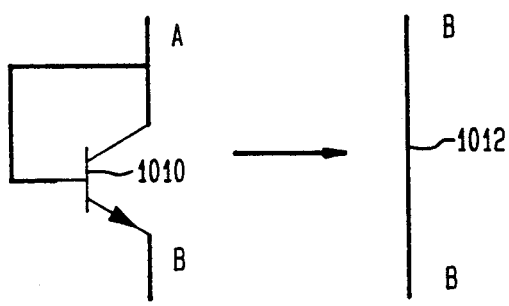

In operation, circle 2.1.5, as illustrated in FIG. 10, transistor list TL4 is searched for all transistors 1010 with the base (B) and collector (C) shorted together. The collector (and base) is shorted to the emitter as shown in FIG. 10 as shown by the connection 1012. All transistor (TL4) and resistor (RL3) lists are updated to be consistent with the changed node numbers. These devices adjust voltage levels and do not contribute to the logic function so they can be replaced with shorts.

Figure 11:
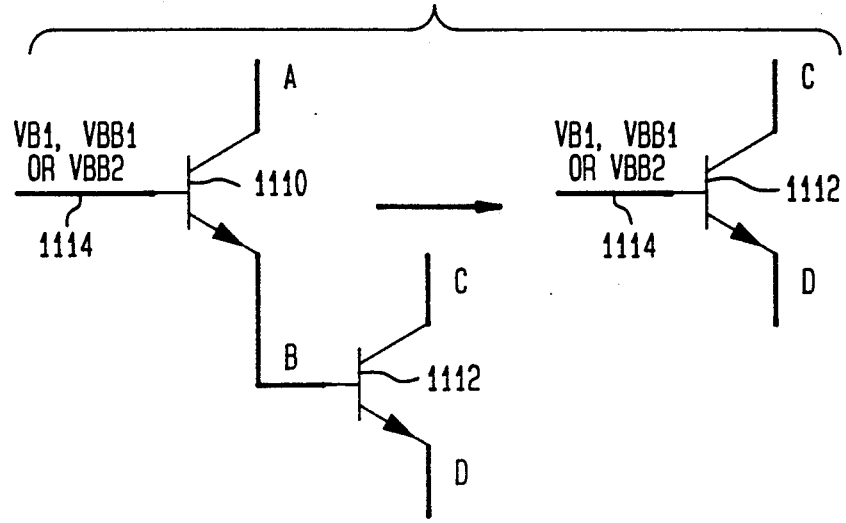

In operation circle 2.1.6, as illustrated in FIG. 11, the transistor list TL5 is searched for all transistors 1110 that have a reference voltage (VB1, VBB1 or VBB2) on the base and the transistor's emitter connected to the base of another transistor 1112. The node 1114 connected to the base of the second transistor 1112 is changed to the same node connected to the base of the second transistor 1110, and the first transistor 1110 is removed. FIG. 11 depicts this operation in terms of the actual circuit modification wherein such transistors adjust the voltage level on the interim node B and provide no contribution to the logic function.

Figure 12:
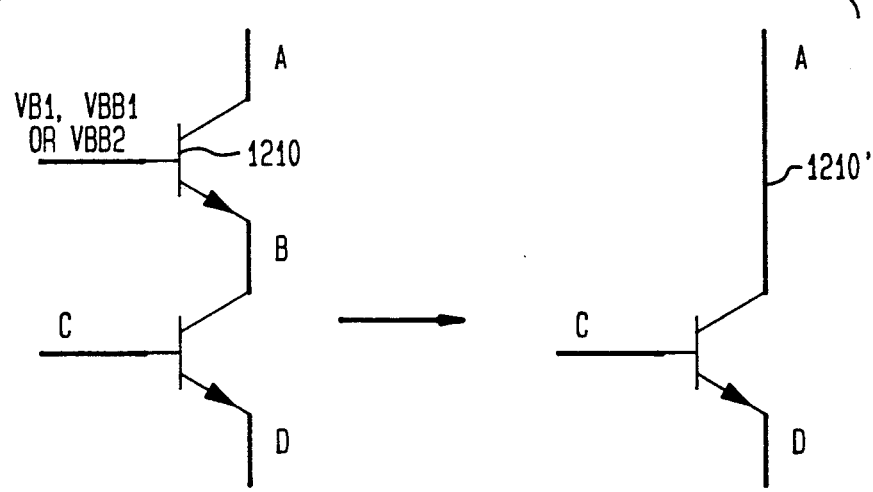

In operation circle 2.1.7, the operation calls for searching the transistor list TL6 and removing all transistors that have a reference voltage on the base (VB1, VBB1 or VBB2) and that have emitters that are not connected to another transistors emitter or base. FIG. 12 illustrates such an identified transistor 1210 in its left hand portion which is then changed to a short 1210' as shown in the right hand portion wherein the identified transistor serves for dynamic considerations and does not contribute to the logic functionality of the circuit.

Figure 13:
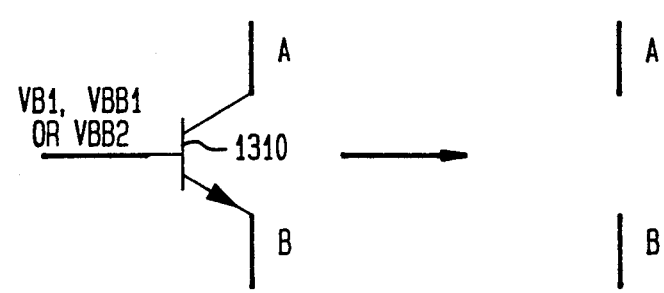

In operation circle 2.1.8 as illustrated by FIG. 13, the transistor list TL7 is searched to remove all have a reference voltage on the base (VB1, VBB1 or VBB2), and whose collector is not a primary output. FIG. 13 illustrates the circuit modification wherein node A is not connected effectively to anything so as to contribute to the logic.

Figure 14:
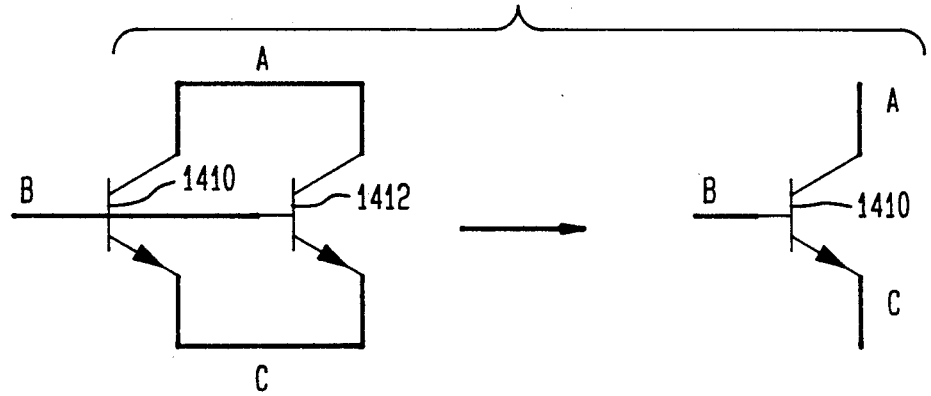

In operation circle 2.1.9, the transistor list TL8 is searched to remove duplicate transistors. Duplicate transistors are transistors with the same collector, base and emitter connections. Such a duplicative pair of transistors 1410 and 1412 are depicted in FIG. 14. Transistor 1412 is removed as illustrated therein.

Figure 15:
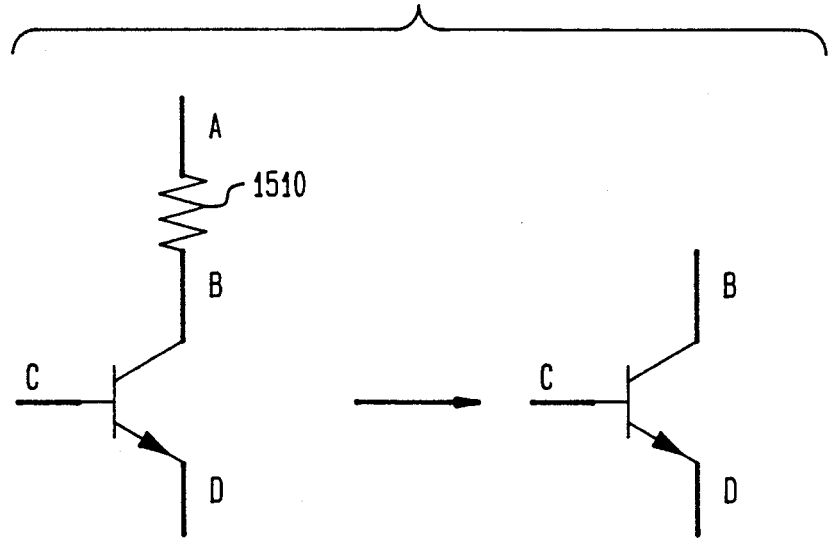

In finally remaining operation circle 2.1.10 of FIG. 4, illustrated in FIG. 15, the resistor list RL4 is searched for dangling resistors (e.g. resistor 1510) that have one (or both) ends unconnected to other circuit elements. FIG. 15 illustrates the circuit modification in which resistor 1510 is deleted.

Figure 16:
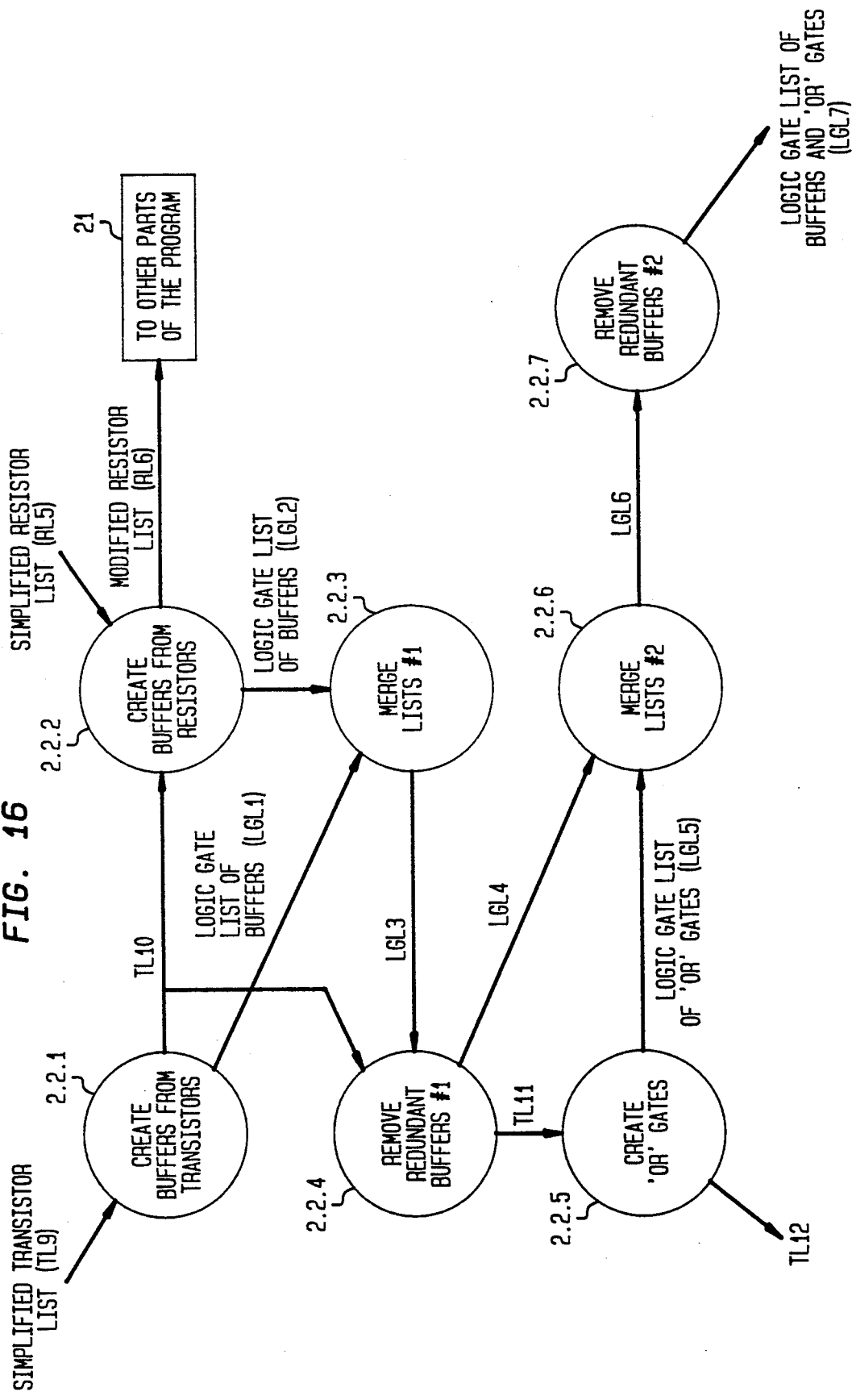
FIG. 16 provides a detailed data flow diagram of create buffers and OR gates function of FIG. 3 involving the appropriate generation of buffers and OR gates.

FIG. 16 depicts a breakdown of operations circle 2.2 in FIG. 3. Basically, these operations analyze the transistor and resistors data lists produced by the process of FIG. 4 and then produces buffers and OR gates responsive to specifically identified circuit conditions. In addition, some minimization is also provided to reduce the complexity of the subsequent logic extraction.

In operation circle 2.2.1 of FIG. 16, the simplified transistor list (TL9) is searched for all transistors that do not have a reference voltage on the base (VB1, VBB1, VBB2 or VCS). In addition, the transistor cannot be in parallel with any other transistors except if the transistors it is in parallel with have reference voltages on their bases (VB1, VBB1 or VBB2).

Figure 17:
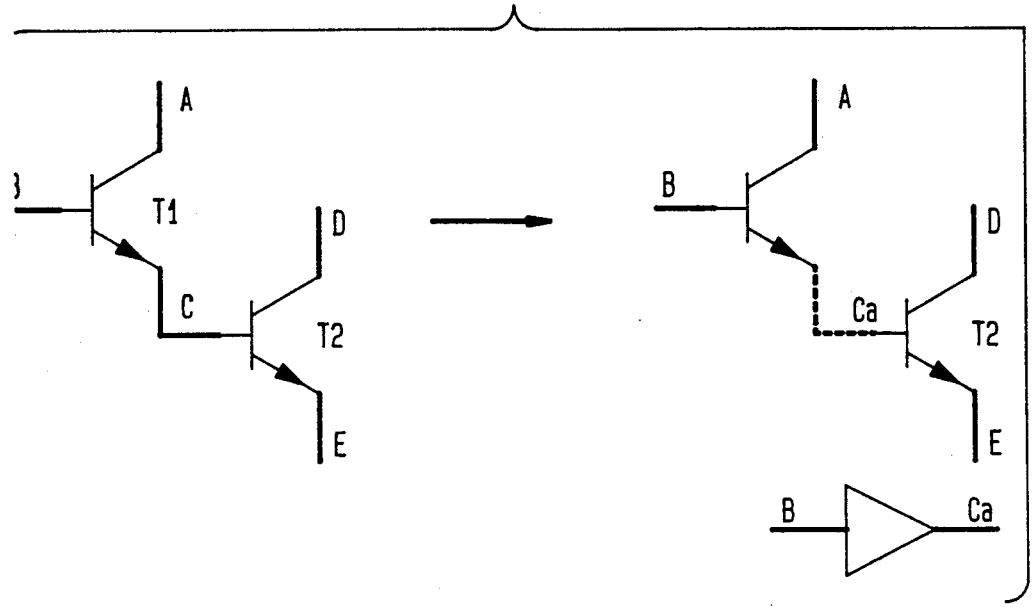
FIGS. 17-24 demonstrate the operations of FIG. 16 in terms of identification of circuit elements and producing buffers and OR gates.
Figure 18:
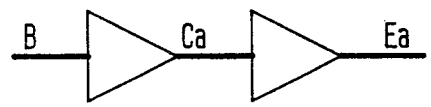

Transistor T1 in FIG. 17 satisfies the requirements; the buffer is produced and the node connected to the emitter of T1, bases of any transistors, and any logic gate inputs are qualified. If T2 also meets the requirements, two buffers would be created as shown in of FIG. 18. The buffer's output node, Ea, is a qualified version of node E.

Figure 19:
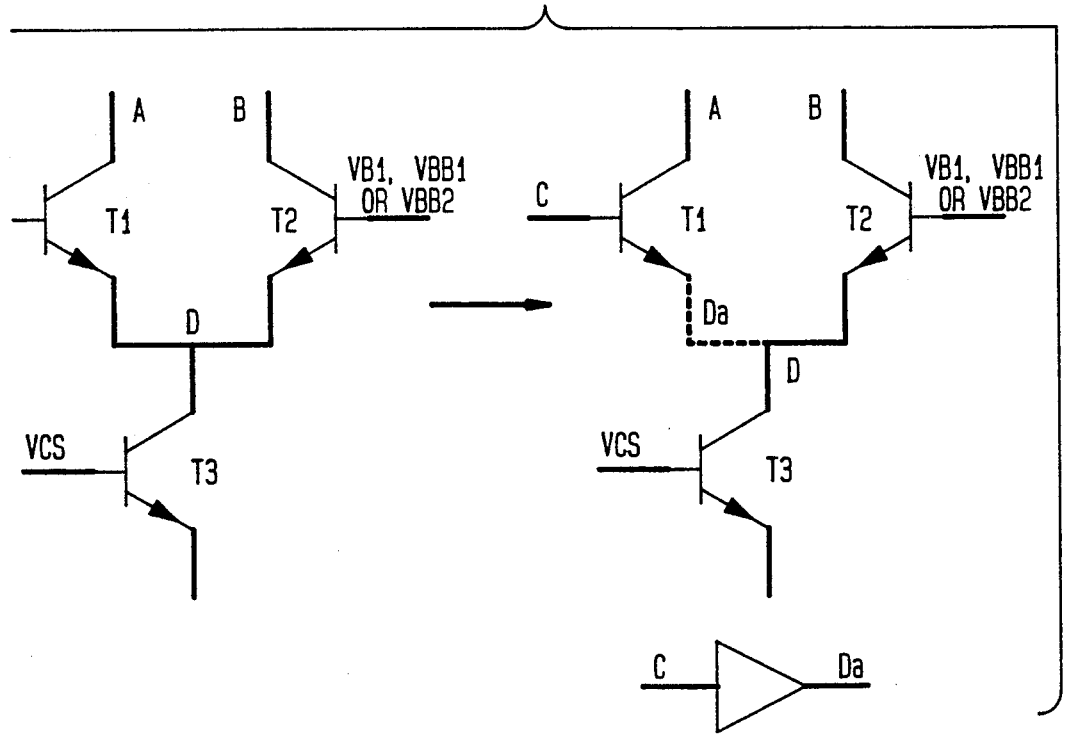

FIG. 19 illustrates another configuration that results in a buffer being produced. It should be noted that buffers are not produced for T2 or T3 because they have reference voltages on their bases.

Figure 20:
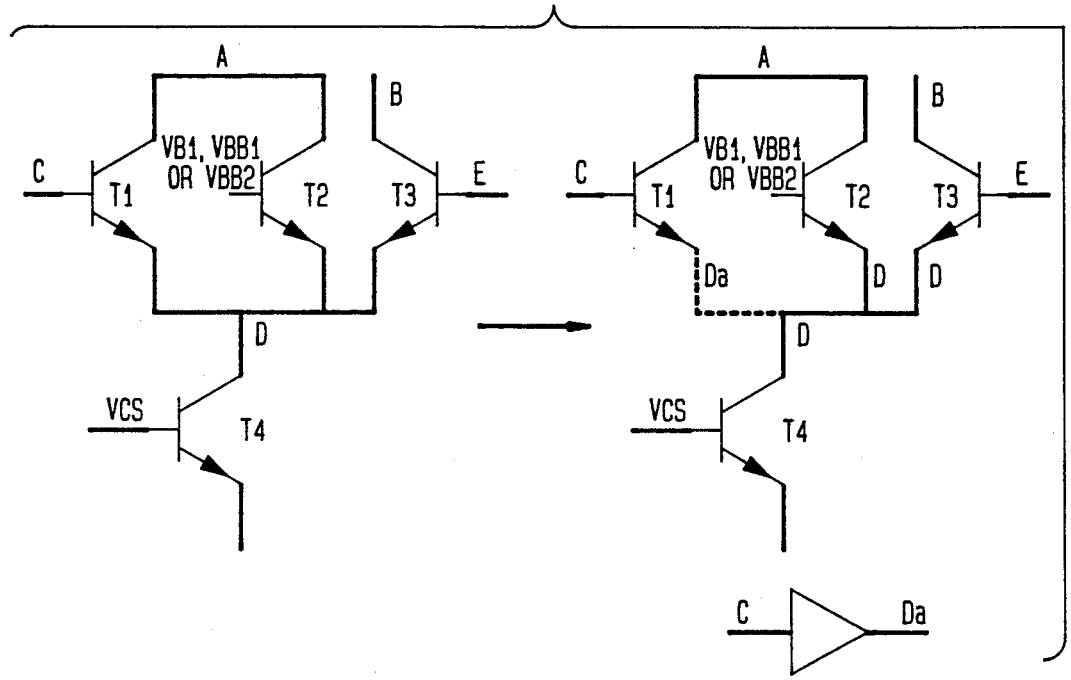

FIG. 20 depicts what happens if the transistor being analyzed (T1) is in parallel with another transistor T2 that has a reference voltage on its base.

Figure 21:
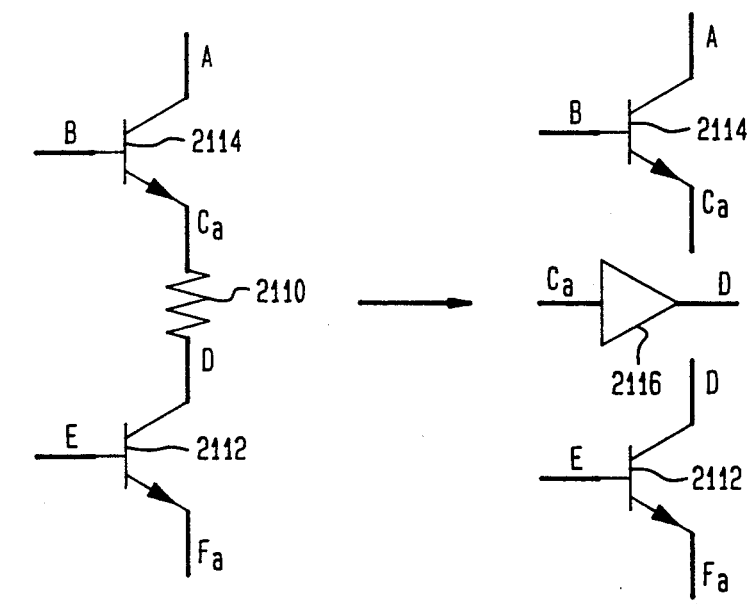

In operation circle 2.2.2, as illustrated in FIG. 21, the simplified resistor list (RL5) is searched for resistors that have one end connected to the collector of a transistor (e.g. 2112) and the other end connected to the emitter of a transistor (e.g. 2114). Either end may optionally be connected to one or more transistor bases. If a resistor meeting these requirements is found, a buffer 2116 is created and the resistor 2110 is deleted. FIG. 21 provides a circuit illustration of the operation represented by circle 2.2.2.

FIG. 16 indicates by operation circle 2.2.3 that logic gate list data of buffers (LGL1) and the logic gate list of buffers (LGL2) produced respectively by operation circles 2.2.1 and 2.2.2 are combined together into one list, LGL3.

Figure 22:
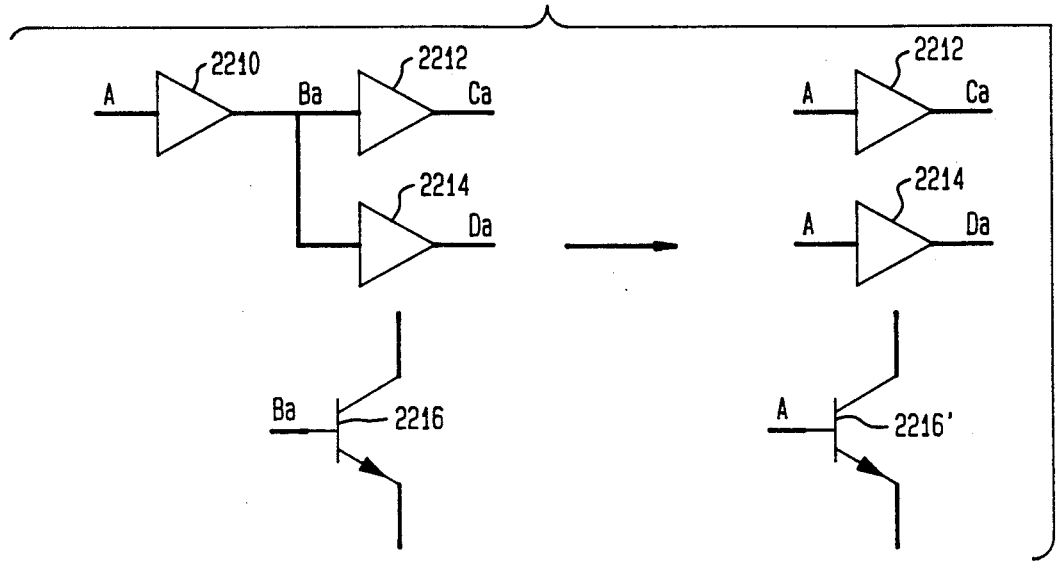

In operation circle 2.2.4 of FIG. 16, (as shown in FIG. 22) the logic gate list LGL3 is searched for one or more buffers 2210, 2212 and 2214 in series. Redundant gates (e.g. 2210) are removed and the gates input nodes are adjusted to reflect the change. In addition, transistors (e.g. 2216) with base connections that, are the same node as a node that has been eliminated are modified (2216') as shown in FIG. 22. Therefore, node B present in the left portion of FIG. 22 is not present in the right hand position after removal of the input buffers.

Figure 23:
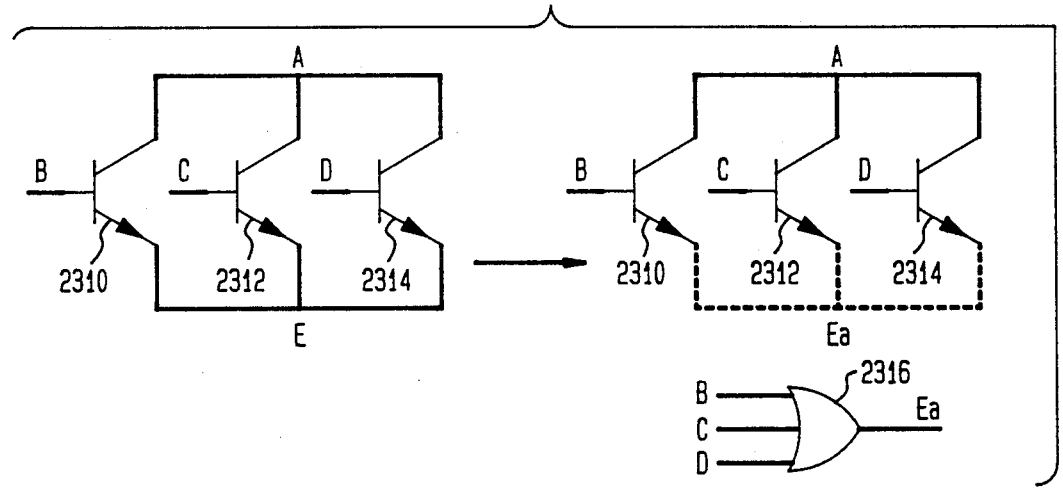

In operation circle 2.2.5 of FIG. 16, the transistors list TL11 is searched for transistors in parallel. Transistors in parallel have collectors connected to the same node, and emitters connected to the same node. FIG. 23 demonstrates the appropriate circuit modification for producing the OR gate. Transistors with a reference voltage (i.e., VB1, VBB1 or VBB2 are excluded from the list of parallel transistors. If transistors 2310, 2312 and 2314 are found that meet the requirements, an OR gate 2316 is created. The output Ea of the OR gate, and the emitters of the parallel transistors are qualified.

In FIG. 16, the logic gate list LGL4 and the logic gate list of OR gates (LGL5) are combined together into one list, LGL6 which is produced at the output of operation circle 2.2.6.

Figure 24:
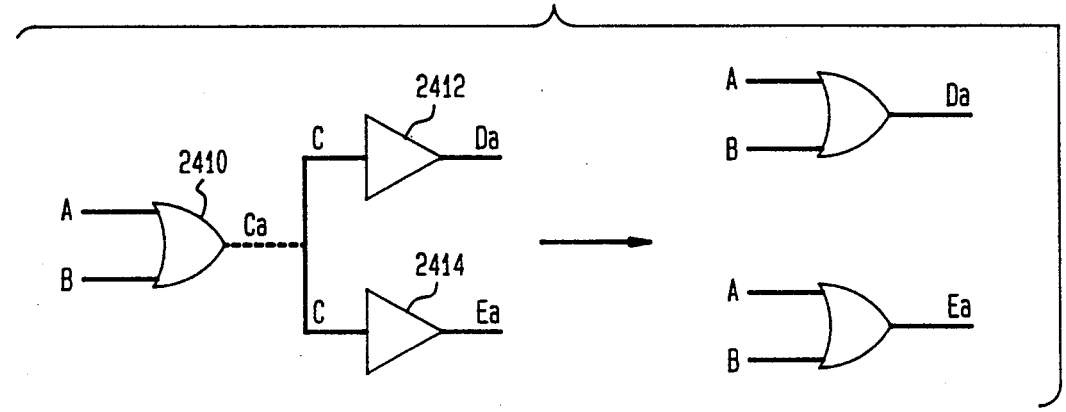

In operation circle 2.2.7 of FIG. 16, as illustrated in FIG. 24 the logic gate list LGL6 is searched for OR gates (e.g. 2410) that output of one or more buffers (e.g. 2412 and 2414). If an OR gate is found that satisfies this requirement, the buffers are eliminated as shown in FIG. 24. For purposes of the search the qualifier on the output of the OR gate 2410 is ignored.

Figure 25:
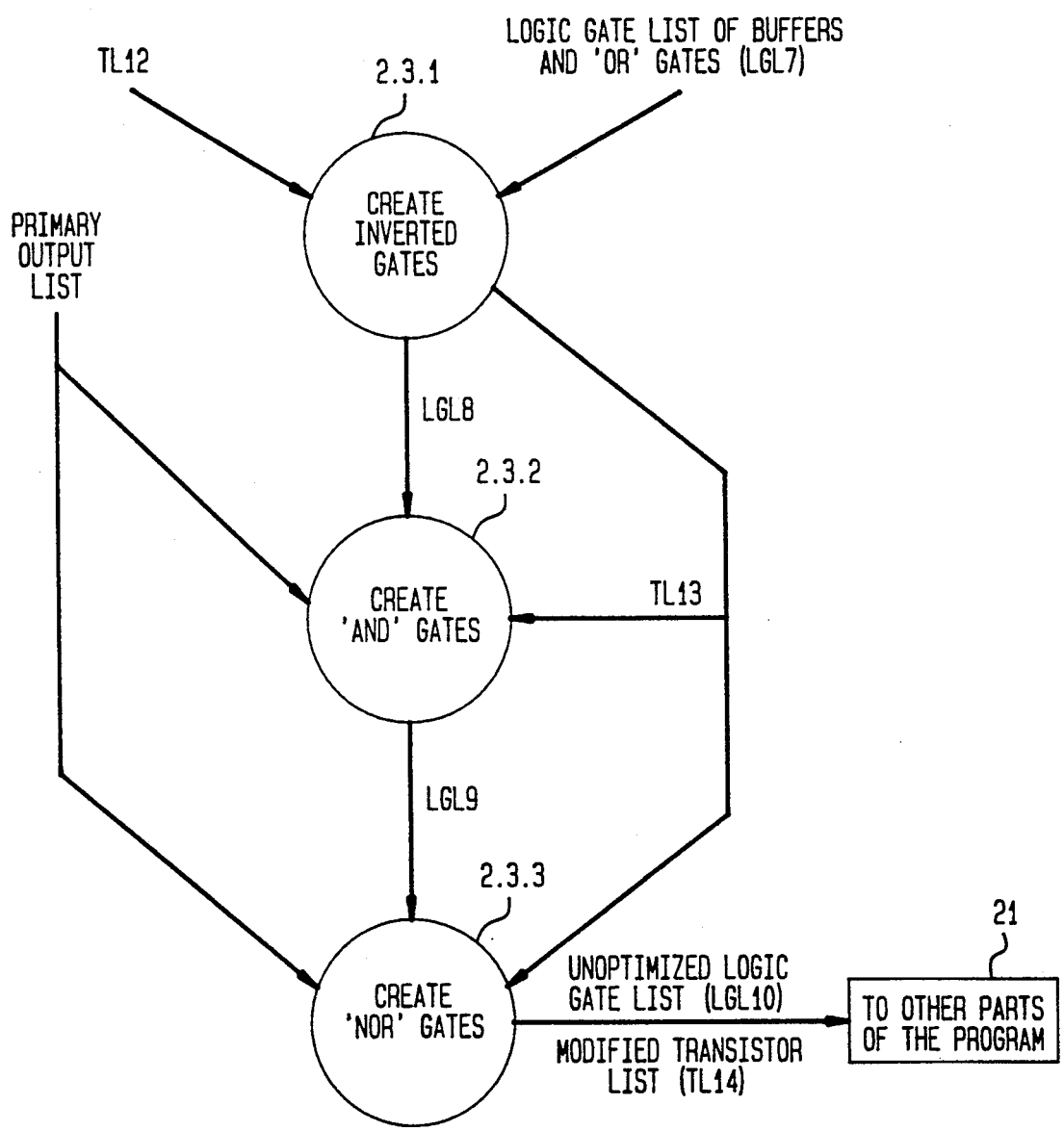
FIG. 25 expands the create inverted gates, 'AND' gates and 'NOR' gates function of FIG. 3 into three functions each specific to a particular logic function.

FIG. 25 depicts the operational process for producing the logic gates and the interconnections associated with inverting transistors, series transistors and logical NOR operation. Accordingly, the process of FIG. 25 produces inverted gates, AND gates, and NOR gates.

In operation circle 2.3.1 of FIG. 25, the transistor list TL12 produced from FIG. 16 is searched for "inverting transistors." An inverting transistor is a transistor with a reference voltage (i.e., VB1, VBB1 or VBB2) on the base.

Once the inverting transistor is found, the transistors that have emitters connected to the inverting transistor's emitter are also analyzed. The corresponding logic gates are found (from the Logic Gate List of Buffers and OR Gates (LGL7)), the appropriate logic gates are created, and the necessary connections made. A summary of the cases handled by the logic extraction program will be presented, followed by a description the way each case is handled.

Figure 26:
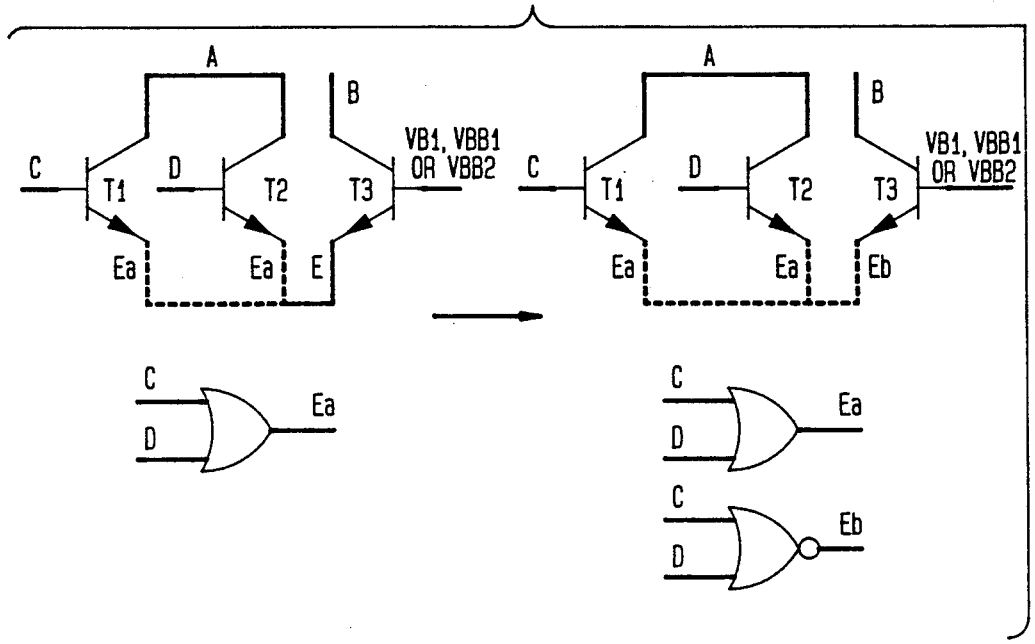
FIGS. 26-33 illustrate the identification of particular circuit elements and producing appropriate logic elements of FIG. 25.

Case 1: Only one transistor, or a set of parallel transistors have emitters connected to the inverting transistors emitter. FIG. 26 illustrates the change in circuitry associated with this situation.

Figure 27:
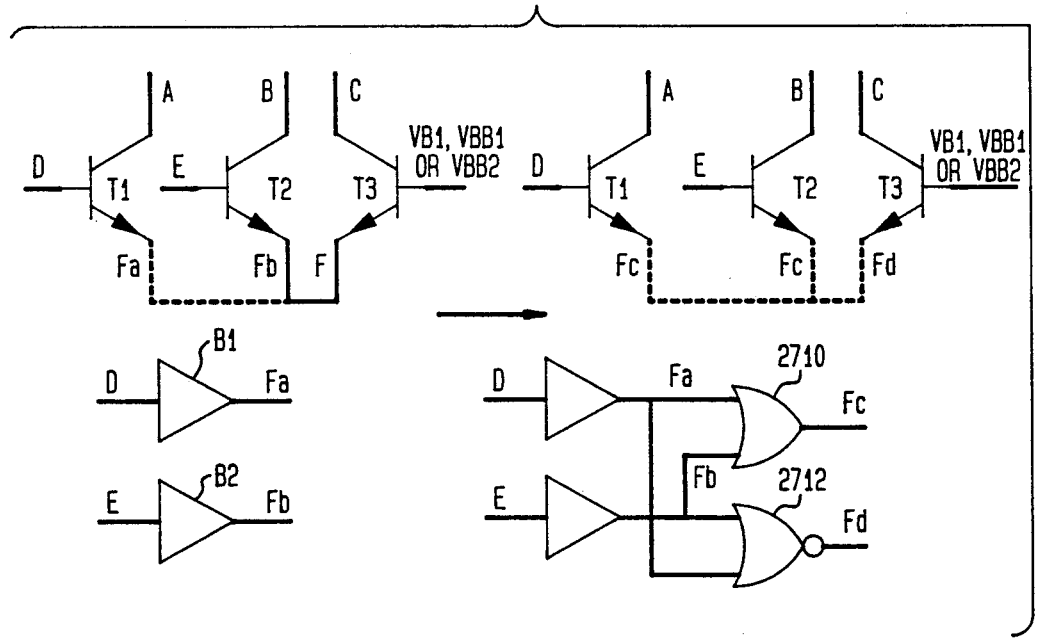

Case 2: Multiple non-parallel transistors, or multiple set of parallel transistors have emitters connected to the inverting transistors emitter. FIG. 27 demonstrates the appropriate modification in terms of circuitry involved.

Figure 28:
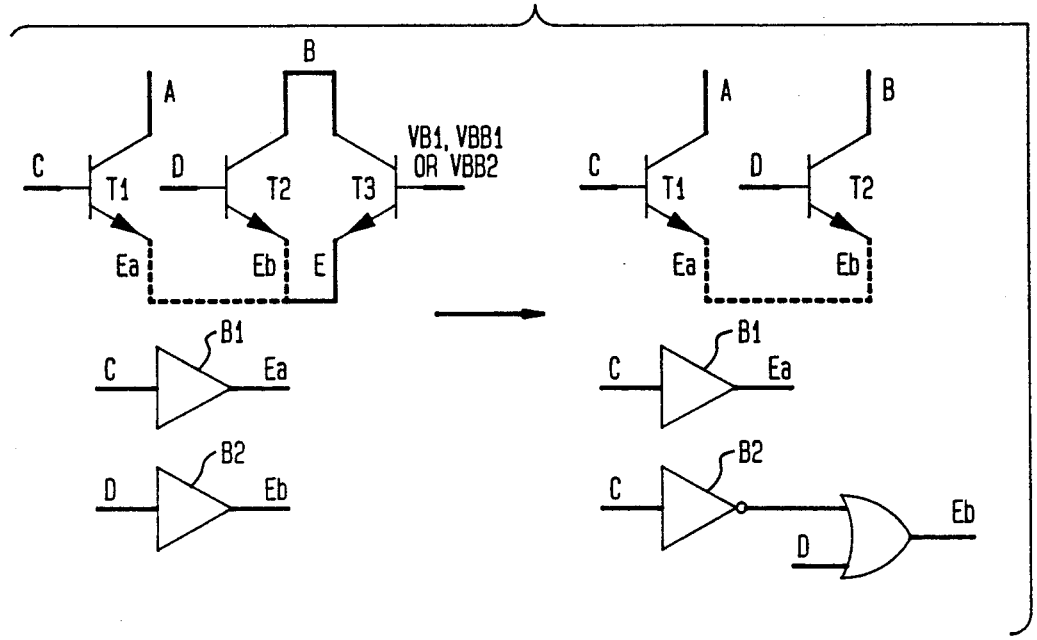

Case 3: A transistor is in parallel with the inverting transistor. These circuit changes are illustrated in FIG. 28.

It should be noted if the collector of the inverting transistor is connected to VCC, it is not necessary to create an inverted gate because the inverting transistor does not contribute to the logic operation of the circuit.

Further consideration will now be given to these three cases.

Case 1 (The Simple Case)

When an inverting transistor is found (See transistor T3 in FIG. 26), the transistors that have common emitter nodes are identified (transistors T1 and T2). The previously created gate that outputs to node Ea, the same node as T1 and T2's emitter, is also found. An inverted copy of the logic gate is created (a NOR gate in this case). the output of the NOR gate and T3's emitter are qualified.

In the previous example, the parallel transistors (TI and T2) and the OR gate could have been replaced with a single transistor and a buffer with analogous results.

Case 2 (The Multiple Case)

FIG. 27 demonstrates the case were multiple, non-parallel, transistors (T1 and T2) share the same emitter node as the inverting transistor T3. The logic gates (B1 and B2) that output to the same qualified nodes as the transistors (T1 and T2) qualified emitter nodes are located. Thus, the buffer B1 outputting to node Fa corresponds to transistor T1 and the buffer B2 outputting to node Fb corresponds to transistor T2.

The T1 and T2 configuration results in a logical OR function, so a corresponding OR gate 2710 is created. Once the OR gate 2710 is created, a inverted copy 2712 is created that represents the inverting transistor T3.

The emitters of the transistors T1, T2 and T3 are all updated to reflect the qualifiers on the outputs of the OR gate 2710 and NOR gate 2712 gates.

In the previous example, the transistors (T1 and T2) and buffers (B1 and B2) could have been replaced with parallel transistors (not shown) and OR gates (not shown) with analogous results. Parallel transistors in this case would mean multiple sets of parallel transistors, if only a single set of parallel transistors then it becomes the simple case described in Case 1, above.

Case 3

In this case, depicted in FIG. 28, the inverting transistor (T3) is in parallel with another transistor (T2). We precede as before, find the transistors T1 and T2 with common emitter connections and the corresponding logic gates B1 and B2.

An inverted copy of the logic gate corresponding to transistor T1 is created and is used as an input to the OR gate that results form the parallel transistors T2 and T3. In this case, the logic gate corresponding to T2 is a buffer, and can easily be optimized out (deleted) as is shown in FIG. 28.

Either T1 or T2 could be replaced with parallel transistors with analogous results. The circuit would not be optimized in this case and would result in a NOR gate (not shown) (corresponding to inverted T1) and an OR gate (not shown) (corresponding To T2) feeding an OR gate (not shown) (corresponding to the parallel combination of T2 and T3).

Now in progressing through FIG. 25 to operation circle 2.3.2, the transistor list TL13 is searched for transistors that have collectors connected to another transistors base, or to a primary output. Starting with the transistor that satisfies this requirement, all transistors in series with it are found. Transistors in series are defined as the transistor's emitter connected to the collector of the following transistor. The series continues until a transistor with VCS on its base is found, or when there are no more transistors in series.

Below is a summary of the two cases handled by the logic extraction program, followed by a description of how each case is handled.

Case 1: A simple series of transistors (See FIG. 29, FIG. 30, and FIG. 31).

Figure 32:
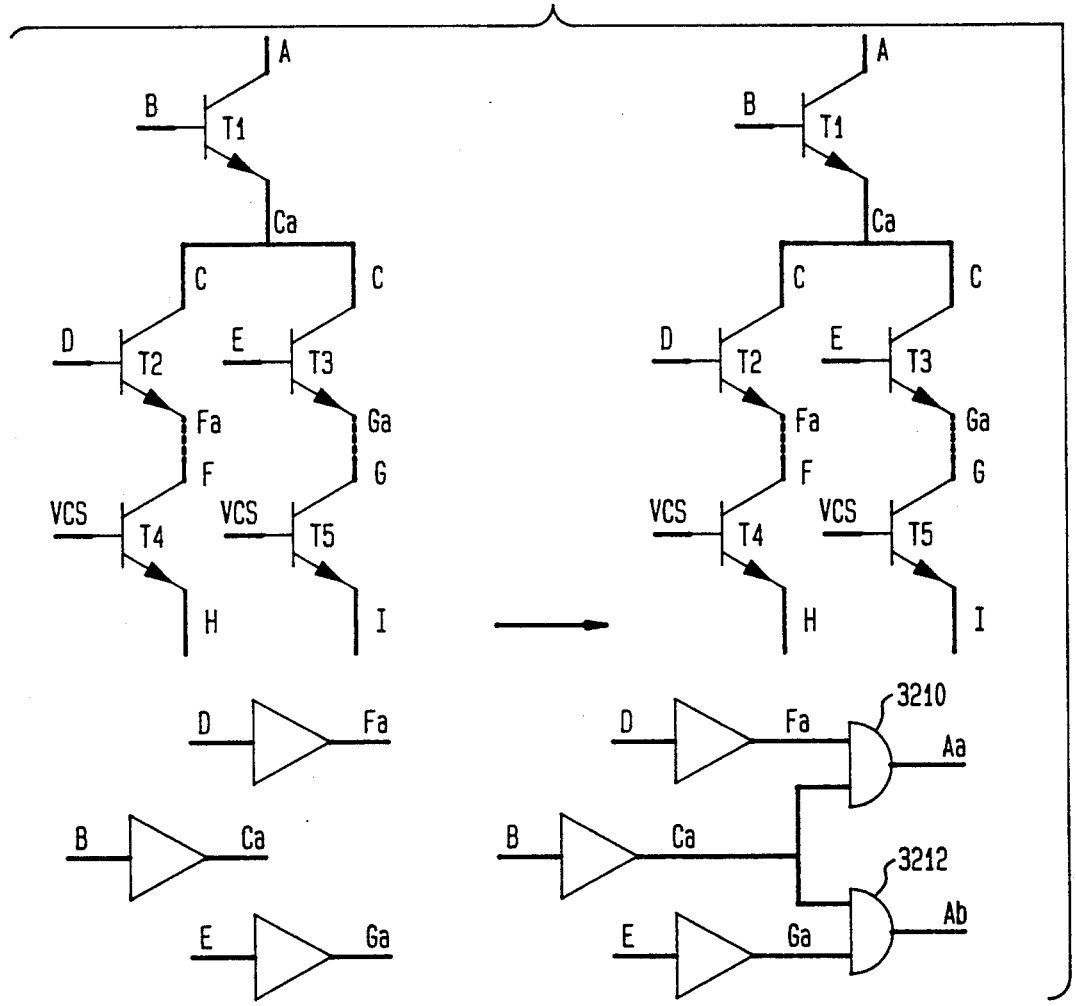

Case 2: Multiple connection paths of transistors are depicted in FIG. 32.

Further attention will now be depicted to these two cases.

Case 1 (The Simple Case)

Figure 29:
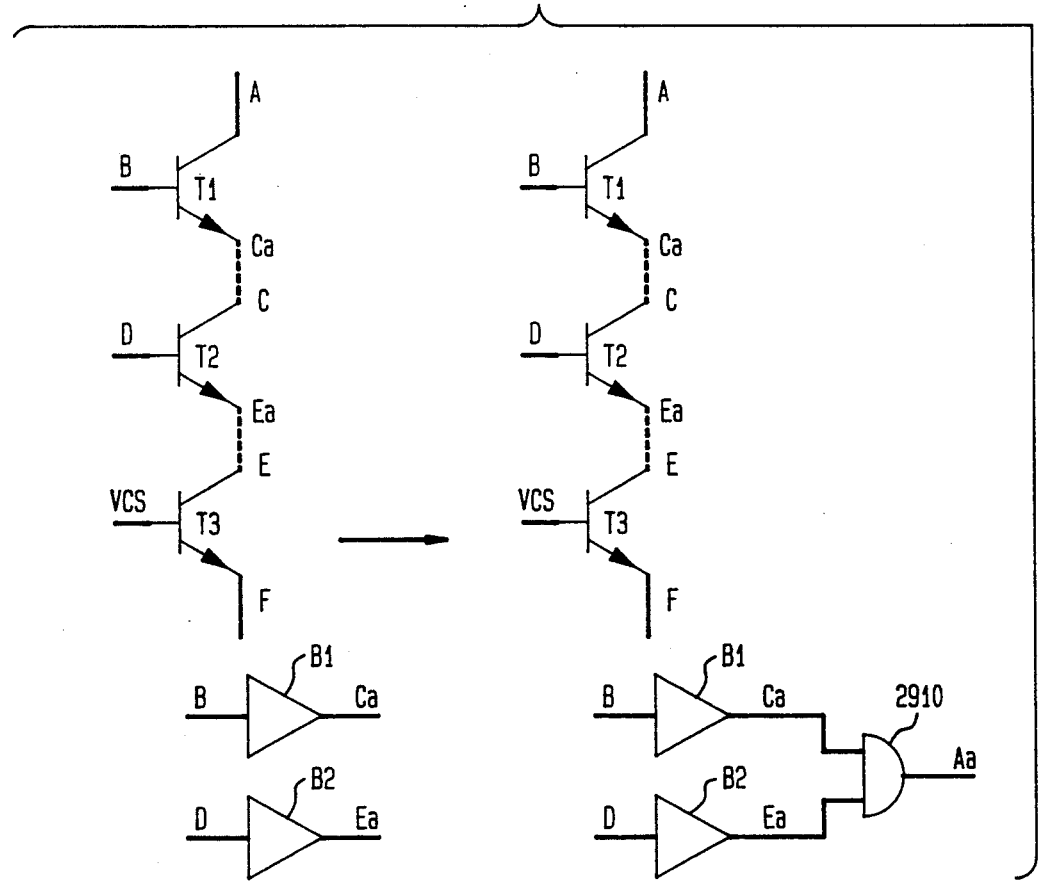

FIG. 29 depicts a series of two transistors (T1 and T2). T3 is not in the series because it has VCS on the base. As for operation, the corresponding logic gates are found, and are used as input into an AND gate 2910. The transistor are not modified, and the output of the AND gate 2910 is qualified.

Figure 30:
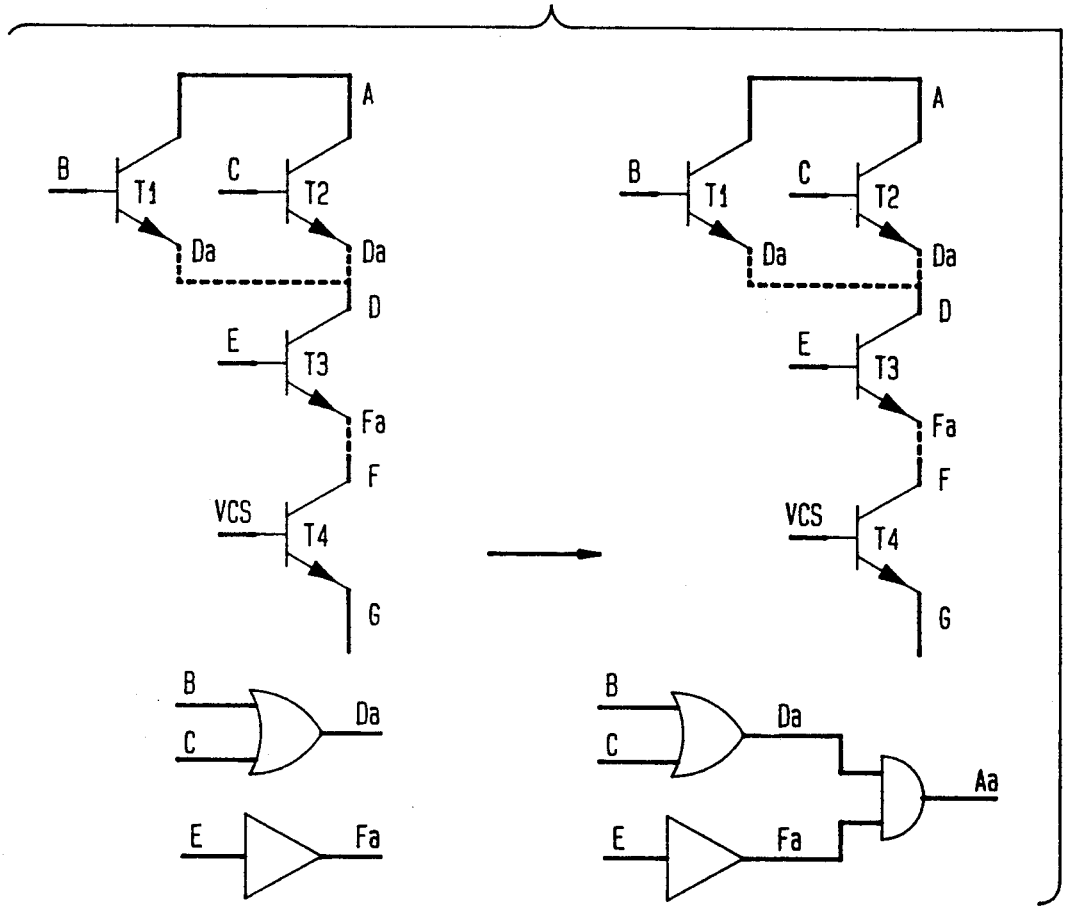

FIG. 30 demonstrates the case were parallel transistors T1 and T2 are in series with analogous results.

Figure 31:
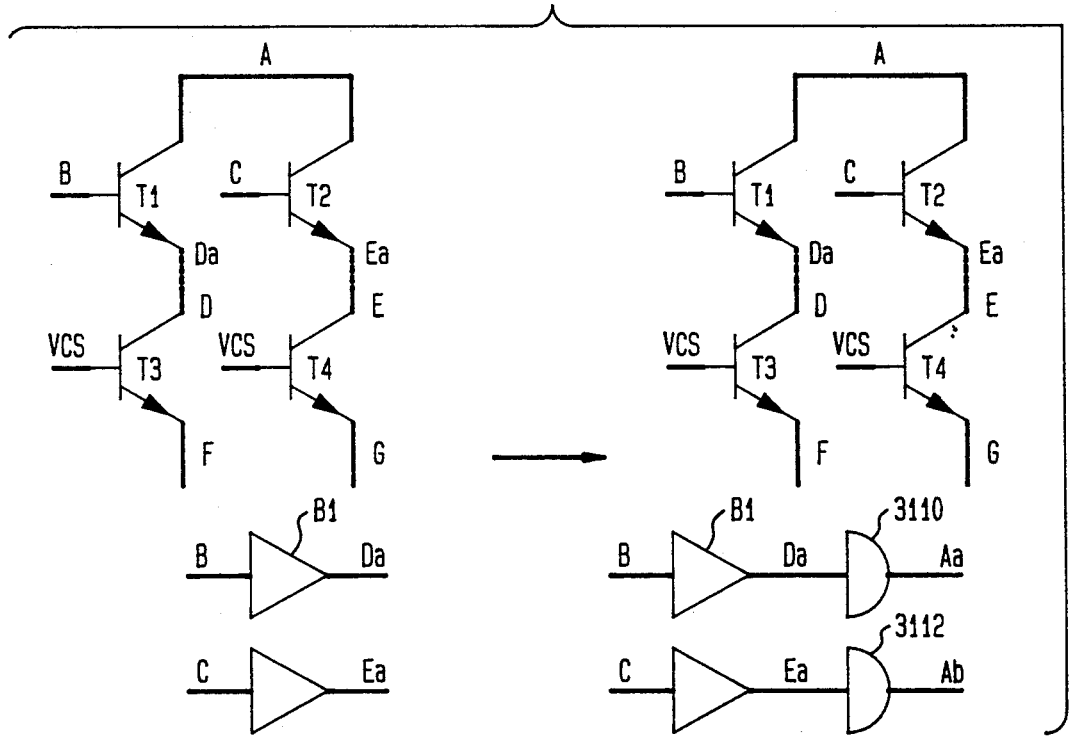

FIG. 31 depicts two features at once. Firstly, it shows what happens when there is only a single transistor in a series. Transistor T1 is a single transistor in a series (remember, do not include T3 because it has VCS on its base), likewise, T2 is a single transistor in a series. This results in the simple case where a buffer B1 is the only input to an AND gate (e.g. 3110 or 3112). If desired, this can be optimized by replacing this with a single buffer (not shown).

Secondly, FIG. 31 demonstrates what happens when more than one set of series transistors is connected to the same node (node A). An AND gate is created for each set of series transistors, each with a unique node qualifier.

In general, each series of transistors can be any length long, can be made up of buffers, OR gates or NOR gates. In addition, several sets of transistors can all have the top transistors collector connected to the same node with analogous results.

Case 2

Instead of a single sequence of series transistors it is possible to have a tree of series transistors. Referring to FIG. 32, a tree of series transistors is defined as having one top transistor T1 (defined the same as above) whose emitter node connects to the collectors of multiple, non-parallel, transistors T2 and T3 (See FIG. 32). Multiple AND gates (e.g. 3210 and 3212) are created for each path of the tree and the output of each AND gate is uniquely qualified.

Figure 33:
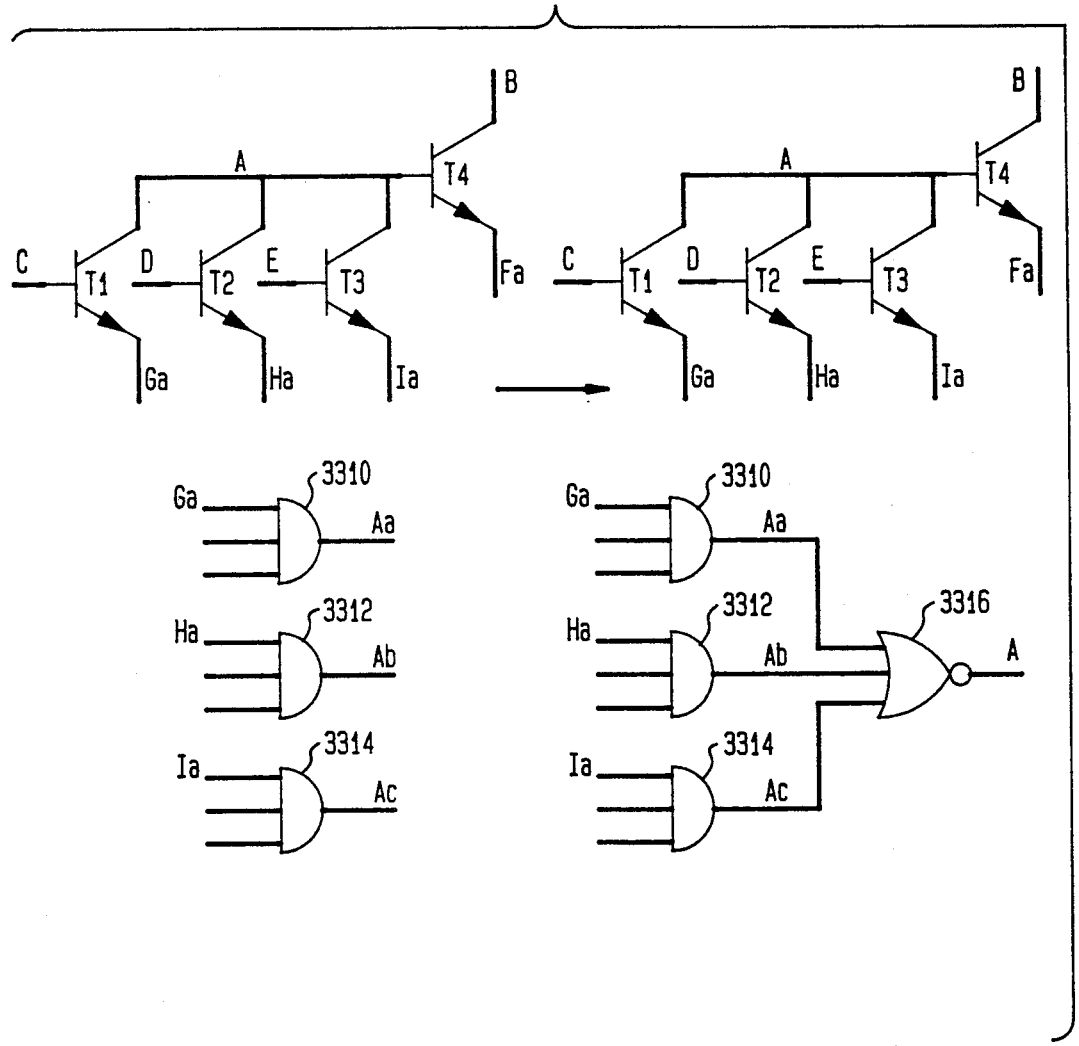

The final operation circle 2.3.3 of FIG. 25 as illustrated by FIG. 33 accepts the transistor list TL13 and searches for transistors T1, T2 and T3 that have collectors connected to another base of a transistor T4, or to a primary output. It should be pointed out that this is the same requirement for the top transistor in the series found for the AND gate creation in operation circle 2.3.2 as illustrated in FIG. 33.

If a transistor is found, the logic gate list LGL9, is searched for all logic gates that output to the same node as the transistors collector (ignoring qualifiers). This will include all AND gates 3310, 3312 and 3314 produced by operation circle 2.3.2.

Once all the logic gates are found, a NOR gate 3316 is created with all the AND gates 3310, 3312 and 3314 as inputs. The output of the NOR gate 3316 is unqualified.

In the degenerate case (not shown), only a single AND gate will feed the NOR gate, which is the same as one NAND gate. In the even more degenerate case, a one input AND gate will feed a one input NOR gate which is the same as an inverter.

Figure 34:
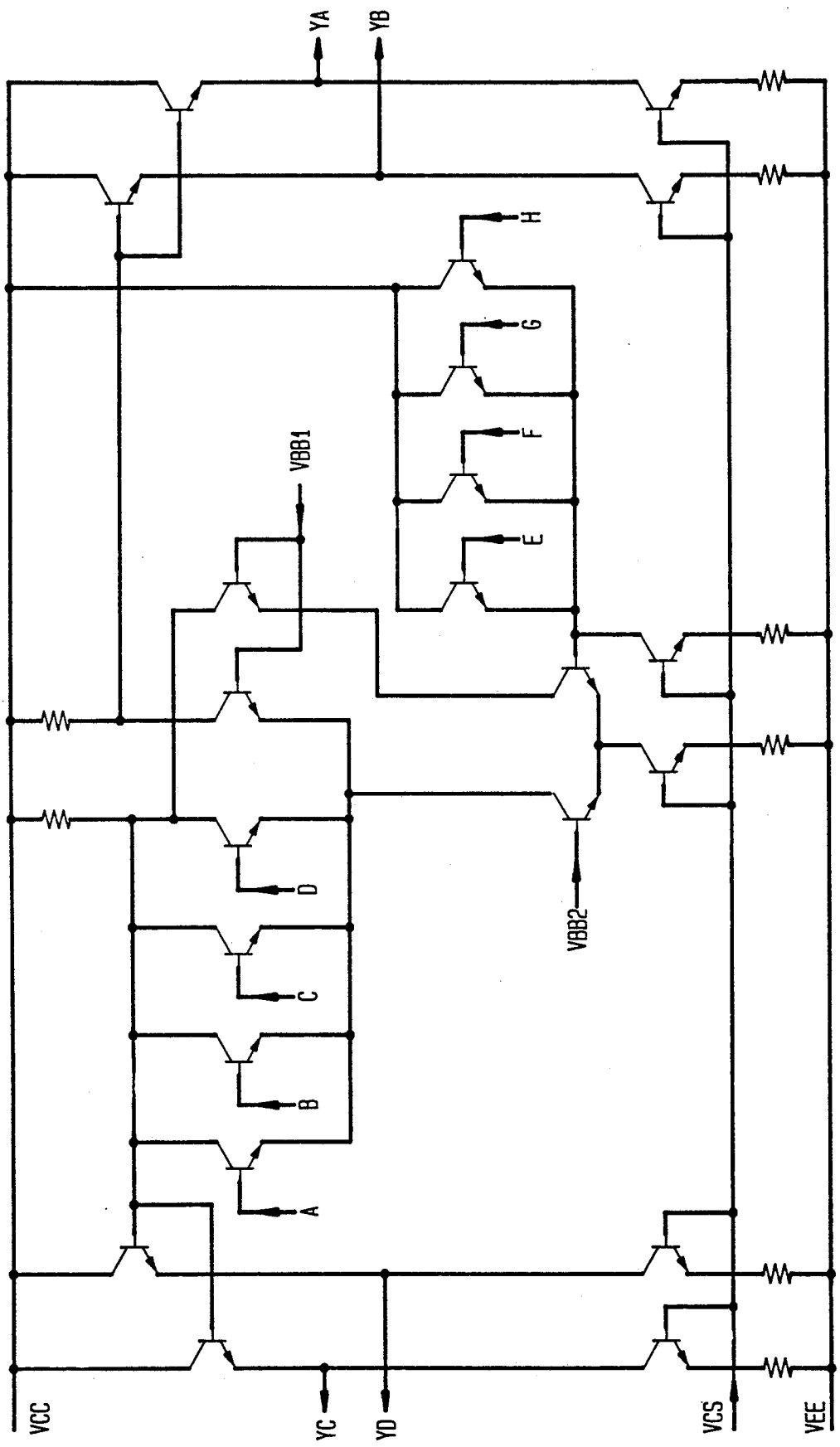
FIG. 34 is a schematic diagram of a typical actual circuit represented in a data netlist.
Figure 35:
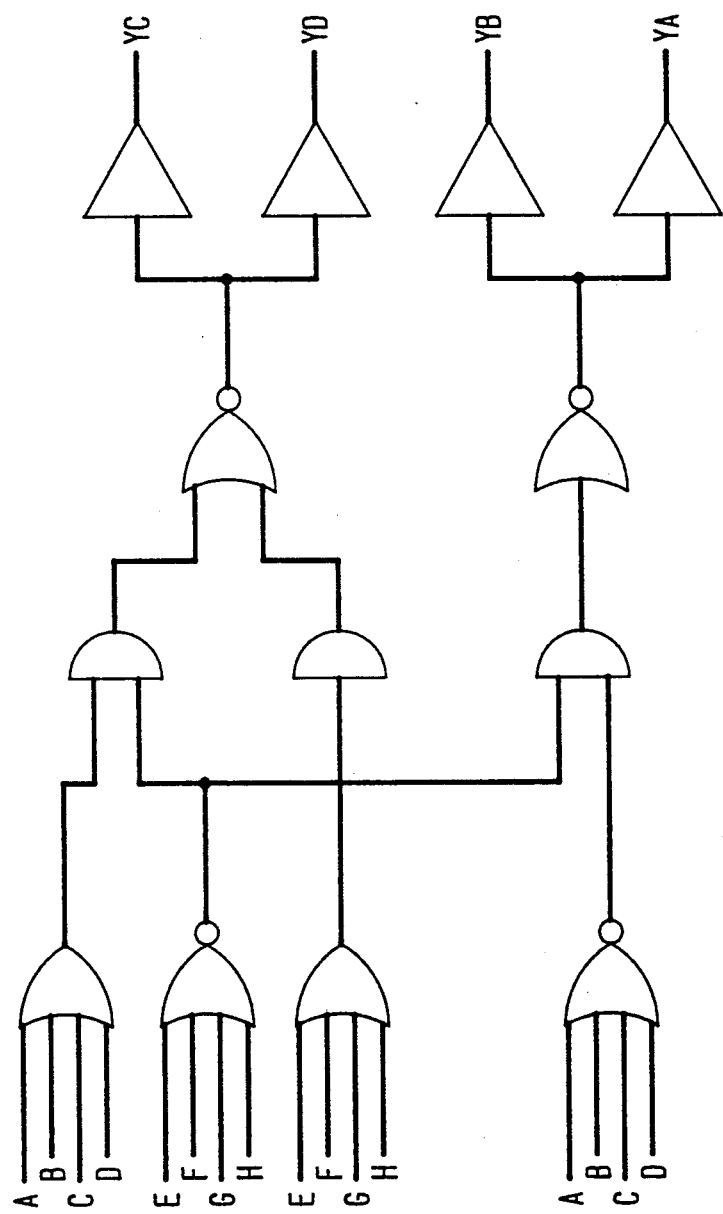
FIG. 35 illustrates the logic netlist representation derived from the data netlist according to the circuit of FIG. 34.

FIGS. 34 and 35 provide an example of the performance of the logic extraction process in accordance with the principles of the invention. The schematic diagram in FIG. 34 is for an eight input (A–H) OR/NOR gate is but one example of an actual circuit represented by the netlist of data in SPICE file 11 in FIG. 1. After proceeding through the logic extraction process of FIGS. 1–4, 16, and 25, a data output is produced indicative of the logic circuit diagram of FIG. 35. As mentioned earlier in the specification, the advantage of this process is that the circuitry represented in file 11 may be indicative of anyone of a wide range of ECL or CML circuits, the extracted logic is patterned after the arrangement of the circuitry indication in file 11 to enable assignment of timing delays for the logic elements, and the extracted logic serves as a logic simulation model suitable for interfacing with a conventional logic simulator known to those skilled in the art.

There has thus been shown and described a novel logic extraction process which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

APPENDIX

Data Dictionary

ASCII SPICE Data =
  Circuit Name +
  Primary Input Nodes Number List +
  Primary Output Nodes Number List +
  Complete Transistor List (TL1) +
  Complete Resistor List (RL1) +
  Node Name vs. Node Number Cross Reference List
Base Node Number = the node number for the base node of the transistor.
Buffers Create From Transistors = list of Logic Gate
Buffers Create From Resistors = list of Logic Gate
Circuit Name = the name of the circuit contained in the SPICE file.
Collector Node Number = the node number for the collector node of the transistor.
Complete Resistor List = a list of
  Resistor Name +
  Node Number R +
  Node Number W
Complete Transistor List = a list of
  Transistor Name +
  Collector Node Number +
  Base Node Number +
  Emitter Node Number +

Deletion Complete Flag = a flag that indicates all transistor deletion has been completed.
Emitter Node Number = the node number for the emitter node of the transistor.
Gate Type = the type of logic gate. Valid types are buffer, inverter, AND, NAND, OR and NOR gates.
Gate Name = a unique name for each instance of a logic gate.
Input Pin List = a list of Pin Node Number
LGL3 =
  Logic Gate List of Buffers (LGL1) +
  Logic Gate List of Buffers (LGL2)
LGL4 =
  LGL3 −
  Buffers deleted with "2.2.4 Remove Redundant Buffers #1"
LGL6 =
  LGL4 +
  Logic Gate List of OR Gates (LGL5)
LGL8 =
  Logic Gate List of Buffers and OR Gates (LGL7) modified by "2.3.1 Create Inverted Gates" +
  Logic Gates added with "2.3.1 Create Inverted Gates"
LGL9 =
  LGL8 +
  Logic Gates added with "2.3.2 Create AND Gates"
Logic Gate =
  Gate Type
  Gate Name
  Input Pin List
  Output Pin
Logic Gate List of Buffers (LGL1) = a list of Buffers Create From Transistors
Logic Gate List of Buffers (LGL2) = a list of Buffers Create From Resistors
Logic Gate List of Buffers and OR Gates (LGL7) =
  LGL6 −
  Logic gates removed with "2.2.7 Remove Redundant Buffers #2"
Logic Gate List of OR Gates (LGL5) = a list of OR Gates Created from Transistors
Modified Transistor List (TL14) =
  TL13 modified with "2.3.3 Create NOR Gates" +
  NOR Gates added with "2.3.3 Create NOR Gates"
Modified Resistor List (RL6) =
  Simplified Resistor List (RL5) −
  Resistors removed with "2.2.2 Create Buffers From Resistors"
Node Name = the name associated with a circuit node.
Node Name vs. Node Number Cross Reference List = a list of
  Node Name +
  Node Number
Node Number = the number associated with a circuit node.
Node Number R = the node number of one end of the resistor.
Node Number W = the node number of the other end of the resistor.
OR Gates Created from Transistors = a list of Logic Gate
Output Pin =
  Pin Node Number
Primary Input List = a list of
  Primary Input Node Name +
  Primary Input Node Number Primary Input Node Name = a name associated with the primary input.
Primary Input Node Number = a node number of a primary input.
Primary Input Node Number List = a list of
  Primary Input Node Number
Primary Output List = a list of
  Primary Output Node Name +
  Primary Output Node Number
Primary Output Node Name = a node name associated with the primary output.
Primary Output Node Number = a node number of a primary output.
Primary Output Node Number List = a list of
  Primary Output Node Number
Resistor Name = a unique name for each resistor.
RL2 =
  RL1 −
  Resistors removed with "2.1.2 Remove Resistors Connected to VCC or VEE"
RL3 =
  RL2 modified with "2.1.3 Short Parallel Resistors" -
  - -
  Resistors removed with "2.1.3 Short Parallel Resistors"
RL4 =
  RL3 modified by "2.1.5 Short C-E Transistors with Shorted B-C"
Simplified Resistor List (RL5) =
  RL4 −
  Resistors removed with "2.1.10 Remove Dangling Resistors"
Simplified Transistor List (TL9) =
  TL8 −
  Transistors removed with "2.1.9 Remove Duplicate Transistors"
TL2 =
  TL1 −
  Transistors removed with "2.1.1 Remove Transistors with B, C =VCC"
TL3 =
  TL2 modified by "2.1.3 Short Parallel Resistors"
TL4 =
  TL3 −
  Transistors removed with "2.1.4 Remove Non-branching VCS Transistors"
TL5 =
  TL4 −
  Transistors removed with "2.1.5 Short C-E Transistors with Shorted B-C"
TL6 =
  TL5 −
  Transistors removed with "2.1.6 Short B-E Level Shifters"
TL7 =
  TL6 −
  Transistors removed with "2.1.7 Short C-E Balance Transistors"
TL8 =
  TL7 −
  Transistors removed with "2.1.8 Remove Current Path Transistors"
TL10 =
  Simplified Transistor List (TL9) −
  Transistors removed with "2.2.1 Create Buffers From Transistors" +
  Transistors modified with "2.2.1 Create Buffers From Transistors"
TL11 = TL10 modified by "2.2.4 Remove Redundant Buffers #1"
TL12 =
  TL11 − Transistors removed with "2.2.5 Create OR Gates"
TL13 = TL12 modified by "2.3.1 Create Inverted Gates"
Transistor Name = a unique name for each transistor.
Unoptimized Logic Gate List (LGL10) =
  LGL9 +
  Logic Gates added with "2.3.3 Create NOR Gates"

I claim:

1. A computer implemented method for producing a logic circuit diagram from a netlist representation of a bipolar semiconductor logic circuit including a plurality of interconnected circuit elements in the form of transistors and resistors, the logic circuit diagram being suitable for logic simulation purposes to verify the actual logic function provided by the netlist, the method comprising the steps of:
   (a) selectively eliminating from the netlist representation those circuit elements failing to contribute to the logic functionality of the bipolar circuit, including all resistors connected to a supply voltage, to provide a simplified data output;
   (b) analyzing the simplified data output for representations of remaining circuit elements of the bipolar circuit to determine their respective logic function by the way they are connected wherein resistor and transistor interconnections are analyzed and a first set of corresponding primitive logic elements are generated said first set of primitive logic elements consisting of buffers and OR gates;
   (c) detecting interconnections between the remaining circuit elements in the contracted data output and generating a second set of corresponding primitive logic elements including inverters, OR, NOR, AND and NAND gates; and
   (d) developing a logic circuit diagram to have a structure corresponding to the interconnection of circuit elements represented by the netlist.

2. The method of claim 1 wherein the netlist representation of a bipolar semiconductor logic circuit including a plurality of interconnected circuit elements in the form of transistors and resistors is designed for emitter coupled logic operation and the logic circuit diagram is indicated by a logic netlist.

3. The method of claim 1 wherein the netlist representation of a bipolar semiconductor logic circuit including a plurality of interconnected circuit elements in the form of transistors and resistors is designed for current mode logic operation and the logic circuit diagram is indicated by a logic netlist.

4. A computer implemented method for producing a logic circuit diagram from a netlist representation of a bipolar semiconductor logic circuit including a plurality of interconnected circuit elements in the form of transistors and resistors, the logic circuit diagram being suitable for logic simulation purposes to verify the actual logic function provided by the netlist, the method comprising the steps of:
   (a) reading a file wherein the netlist resides to provide three data inputs the three data inputs including a primary output list, a complete transistor list and a complete resistor list;
   (b) selectively eliminating, from the three lists, representations of those circuit elements failing to contribute to the logic functionality of the bipolar circuit to provide a simplified data output;

(c) analyzing the simplified data output for representations of remaining circuit elements of the bipolar circuit to determine their respective logic function by the way they are connected wherein resistor and transistor interconnections are analyzed and a first set of corresponding primitive logic elements are generated including buffers and OR gates;

(d) detecting interconnections between the remaining circuit elements in the contracted data output and generating a second set of corresponding primitive logic elements including inverters, OR, NOR, AND and NAND gates; and (e) developing a logic circuit diagram to have a structure corresponding to the interconnection of circuit elements represented by the netlist.

5. A computer implemented method for producing a logic circuit diagram from a netlist representation of a bipolar semiconductor logic circuit including a plurality of interconnected circuit elements in the form of transistors and resistors, the logic circuit diagram being suitable for logic simulation purposes to verify the actual logic function provided by the netlist, the method comprising the steps of:

(a) selectively eliminating from the netlist representation those circuit elements failing to contribute to the logic functionality of the bipolar circuit to provide a simplified data output including the steps of:

a1) removing transistor representations connected to an indication of VCC supply potential from the netlist;

a2) removing resistor representations connected to an indication of VCC supply potential or a VEE supply potential from the netlist;

a3) shorting parallel resistor representations from the netlist;

a4) removing representations of non-branching circuit source transistors;

a5) shorting representations of selected voltage reference transistors;

a6) removing representations of dangling resistors to produce a simplified resistor list;

(b) analyzing the simplified data output for representations of remaining circuit elements of the bipolar circuit to determine their respective logic function by the way they are connected wherein resistor and transistor interconnections are analyzed and a first set of corresponding primitive logic elements are generated including buffers and OR gates;

(c) detecting interconnections between the remaining circuit elements in the contracted data output and generating a second set of corresponding primitive logic elements including inverters, OR, NOR, AND and NAND gates; and (d) developing a logic circuit diagram to have a structure corresponding to the interconnection of circuit elements represented by the netlist.

6. The method of claim 5 wherein step (a) further comprises:

a7) shorting representations of level shifting transistors from the output of step a5 to produce an output;

a8) shorting representations of balance transistors from the output of step a7) to produce an output;

a9) removing representations of current path transistors from the output of step a8 to produce a flag output and a data output;

a10) removing representations of duplicate transistors from the data output of step a9) to produce a simplified transistor list.

7. The method of claim 6 further comprising the steps of:

a11) producing buffers from representations of transistors from the simplified transistor list to produce a data output;

a12) producing buffers from representations of resistors using the data output of step a11) and the simplified resistor list to produce a logic gate list of buffers and a modified resistor list.

8. The method of claim 7 further comprising the step of:

a13) merging the data output of step a11) and t he logic gate list to produce a first list.

9. The method of claim 8 further comprising the step of:

a14 removing selected representations of redundant buffers from the first list using the data output of step a11) to produce a logic data list.

10. The method of claim 9 further comprising the step of:

a15) producing OR gates from representations of transistors in parallel from the data output of step a14) to produce a second logic data list of OR gates and a data output.

11. The method of claim 10 further comprising the steps of:

a16) merging the second logic list and the data output of step a14) to produce a data output; and a17) selectively removing redundant buffers from the data output of step a16) to produce a third logic list of buffers and OR gates.

12. The method of claim 11 wherein step c) further comprises:

c1) producing inverted gates from the data output of step a15) and the third logic list to produce a data output and a data list;

c2) producing AND gates from the data output and list of step c1) to produce a data list;

c3) producing NOR gates from the data list of step c2) and the data output of step c1) to produce an unoptimized logic gate list indicative of the logic circuit diagram.

* * * * *